(12) United States Patent
Tsai et al.

(10) Patent No.: US 9,853,102 B2
(45) Date of Patent: Dec. 26, 2017

(54) TUNNEL FIELD-EFFECT TRANSISTOR

(71) Applicant: TAIWAN SEMICONDUCTOR MANUFACTURING CO., LTD., Hsinchu (TW)

(72) Inventors: Teng-Chun Tsai, Hsinchu (TW); Li-Ting Wang, Hsinchu (TW); Cheng-Tung Lin, Jhudong Township (TW); De-Fang Chen, Hsinchu (TW); Chih-Tang Peng, Zhubei (TW); Chien-Hsun Wang, Hsinchu (TW); Hung-Ta Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/455,598

(22) Filed: Aug. 8, 2014

(65) Prior Publication Data

US 2015/0318213 A1    Nov. 5, 2015

Related U.S. Application Data

(60) Provisional application No. 61/986,663, filed on Apr. 30, 2014.

(51) Int. Cl.
*H01L 29/08* (2006.01)
*H01L 29/78* (2006.01)
(Continued)

(52) U.S. Cl.
CPC ............ *H01L 29/105* (2013.01); *B82Y 10/00* (2013.01); *H01L 21/265* (2013.01);
(Continued)

(58) Field of Classification Search
CPC ....... H01L 27/108; H01L 29/78; H01L 29/06; H01L 29/66; H01L 29/36; H01L 27/02;
(Continued)

(56) References Cited

U.S. PATENT DOCUMENTS

| | | | |
|---|---|---|---|
| 2002/0105036 A1* | 8/2002 | Wang | H01L 29/7885 257/390 |
| 2003/0180994 A1* | 9/2003 | Polishchuk et al. | 438/199 |

(Continued)

FOREIGN PATENT DOCUMENTS

| KR | 20120139067 A | 12/2012 |
|---|---|---|
| KR | 20140030019 A | 3/2014 |

OTHER PUBLICATIONS

Maintaining the benefits of CMOS scaling when scaling bogs down (E.J. Nowak, IBM J. Res. & Dev. vol. 46 No. 2/3 Mar./May 2002).
(Continued)

*Primary Examiner* — Chuong A Luu
(74) *Attorney, Agent, or Firm* — Maschoff Brennan

(57) ABSTRACT

A tunnel field-effect transistor and method fabricating the same are provided. The tunnel field-effect transistor includes a drain region, a source region with opposite conductive type to the drain region, a channel region disposed between the drain region and the source region, a metal gate layer disposed around the channel region, and a high-k dielectric layer disposed between the metal gate layer and the channel region.

20 Claims, 20 Drawing Sheets

(51) Int. Cl.

| | | |
|---|---|---|
| H01L 29/06 | (2006.01) | |
| H01L 29/10 | (2006.01) | |
| H01L 21/8234 | (2006.01) | |
| H01L 27/088 | (2006.01) | |
| H01L 29/66 | (2006.01) | |
| H01L 21/265 | (2006.01) | |
| H01L 29/51 | (2006.01) | |
| H01L 29/739 | (2006.01) | |
| B82Y 10/00 | (2011.01) | |
| H01L 29/423 | (2006.01) | |
| H01L 29/775 | (2006.01) | |
| H01L 29/16 | (2006.01) | |

(52) U.S. Cl.
CPC ........ *H01L 21/823418* (2013.01); *H01L 21/823462* (2013.01); *H01L 21/823468* (2013.01); *H01L 21/823487* (2013.01); *H01L 21/823493* (2013.01); *H01L 27/088* (2013.01); *H01L 29/068* (2013.01); *H01L 29/0649* (2013.01); *H01L 29/0653* (2013.01); *H01L 29/0657* (2013.01); *H01L 29/0676* (2013.01); *H01L 29/0847* (2013.01); *H01L 29/1041* (2013.01); *H01L 29/42376* (2013.01); *H01L 29/517* (2013.01); *H01L 29/518* (2013.01); *H01L 29/665* (2013.01); *H01L 29/66068* (2013.01); *H01L 29/66356* (2013.01); *H01L 29/66439* (2013.01); *H01L 29/66553* (2013.01); *H01L 29/66666* (2013.01); *H01L 29/66977* (2013.01); *H01L 29/7391* (2013.01); *H01L 29/775* (2013.01); *H01L 29/7827* (2013.01); *H01L 29/1608* (2013.01)

(58) Field of Classification Search
CPC ..... H01L 27/092; H01L 27/088; H01L 29/76; H01L 29/08; H01L 29/417; H01L 29/49; H01L 29/10; H01L 29/167
USPC .......................................... 257/10, 407, 369
See application file for complete search history.

(56) References Cited

U.S. PATENT DOCUMENTS

| | | | | |
|---|---|---|---|---|
| 2004/0036126 | A1* | 2/2004 | Chau ...................... | B82Y 10/00 257/401 |
| 2011/0253981 | A1* | 10/2011 | Rooyackers ........... | B82Y 10/00 257/24 |
| 2012/0223390 | A1* | 9/2012 | Liang ................... | H01L 29/4908 257/369 |
| 2012/0306026 | A1* | 12/2012 | Guo et al. ..................... | 257/407 |
| 2013/0134485 | A1* | 5/2013 | Fumitake .............. | H01L 29/808 257/287 |
| 2013/0306621 | A1 | 11/2013 | Chang et al. | |
| 2014/0061775 | A1 | 3/2014 | Chuang et al. | |
| 2014/0252451 | A1* | 9/2014 | Han et al. ..................... | 257/324 |
| 2015/0069458 | A1* | 3/2015 | Li ..................... | H01L 29/66795 257/105 |
| 2015/0303202 | A1* | 10/2015 | Sun ................. | H01L 21/823487 257/392 |

OTHER PUBLICATIONS

TFET—a possible replacement for CMOS in low-power applications (C. Anghel et al., Paris, Aug. 4, 2011).
CMOS-Compatible Vertical-Silicon-Nanowire Gate-All-Around p-Type Tunneling FETs With <50-mV/decade Subthreshold Swing (Ramanathan Gandhi et al., IEEE Electron Device Letters, vol. 32, No. 11, Nov. 2011).
Impact of process and geometrical parameters on the electrical characteristics of vertical nanowire silicon n-TFETs (A. Vandooren et al., Solid-State Electronics 72 (2012) 82-87 ).
Band-to-Band Tunneling in Carbon Nanotube Field-Effect Transistors(J. Appenzeller et al, Physical Review Letters, vol. 93, No. 19, 2004).
Tunneling Field-Effect Transistors (TFETs) With Subthreshold Swing (SS) Less Than 60 mV/dec (Woo Young Choi et al, IEEE Electron Device Letters, vol. 28, No. 8, Aug. 2007 ).
Impact of SOI, Si1-xGexOl and GeOI substrates on CMOS compatible Tunnel FET performance (F. Mayer et al, 2008 IEEE).
Double-Gate Strained-Ge Heterostructure Tunneling FET (TFET) With Record High Drive Currents and < 60mV/dec Subthreshold Slope (Tejas Krishnamohan et al, 2008 IEEE).
Demonstration of Tunneling FETs Based on Highly Scalable Vertical Silicon Nanowires (Z. X. Chen et al, IEEE Electron Device Letters, vol. 30, No. 7, Jul. 2009).
Effect of Pocket Doping and Annealing Schemes on the Source-Pocket Tunnel Field-Effect Transistor (Ritesh Jhaveri et al, IEEE Transactions on Electron Devices, vol. 58, No. 1, Jan. 2011).
Si Tunnel Transistors with a Novel Silicided Source and 46m/Vdec Swing (Kanghoon Jeon et al, 2010 IEEE).
Complementary Silicon-Based Heterostructure Tunnel-FETs With High Tunnel Rates (Anne S. Verhulst et al, IEEE Electron Device Letters, 2008).
Lateral Strain Profile as Key Technology Booster for All-Silicon Tunnel FETs (Kathy Boucart et al, IEEE Electron Device Letters, vol. 30, No. 6, Jun. 2009).
Fringing-Induced Drain Current Improvement in the Tunnel Field-Effect Transistor With High-κ GateDielectrics.(Martin Schlosser, et al, IEEE Transactions on Electron Devices, vol. 56, No. 1, Jan. 2009).
Tunnel field effect transistor with increased ON current, low-k spacer and high-k dielectric (Costin Anghel, et al, Applied Physics Letters 96, 122104, 2010).
30-nm Tunnel FET With Improved Performance and Reduced Ambipolar Current (Costin Anghel, et al, IEEE Transactions on Electron Devices, vol. 58, No. 6, Jun. 2011).
Pending U.S. Appl. No. 14/251,933, filed Apr. 14, 2014.
Bijesh et al., "Demonstration of In0.9Ga0.1As/GaAs0.18Sb0.82 Near Broken-gap Tunnel FET with ION=740μA/μm, GM=700μS/μm and Gigahertz Switching Performance at VDS=0.5V," Electron Devices Meeting (IEDM), 2013 IEEE International, p. 28.2.1-28.2.4.

* cited by examiner

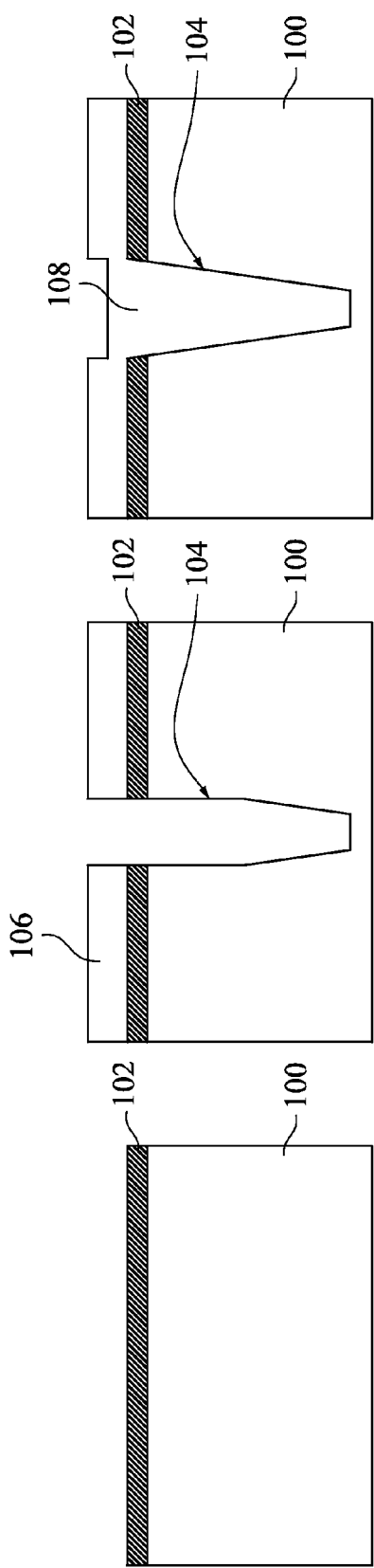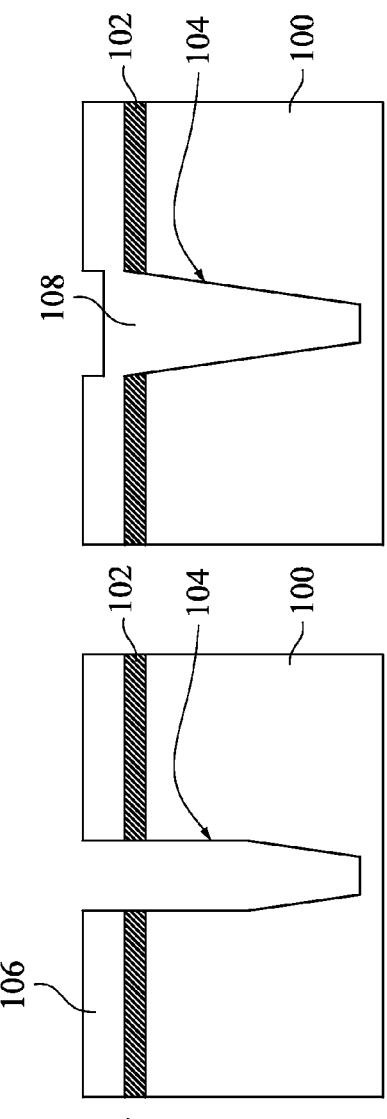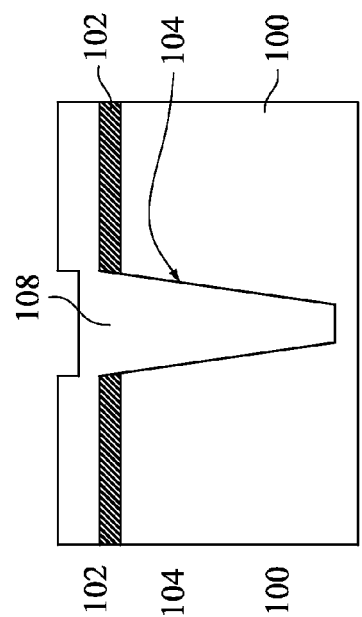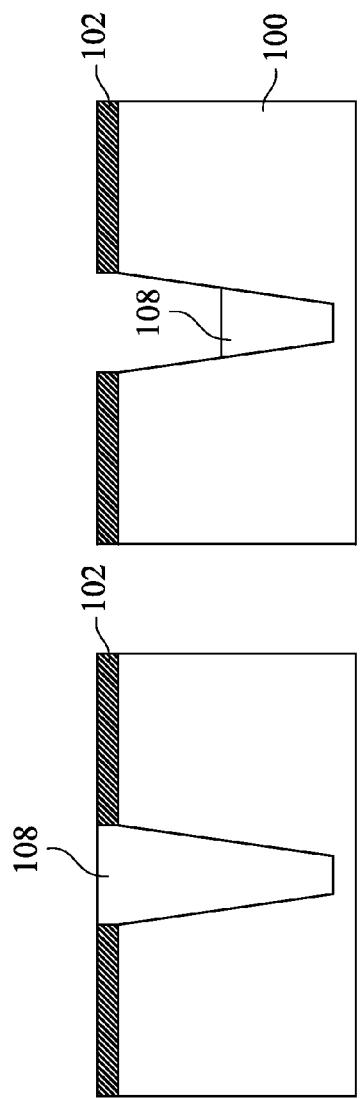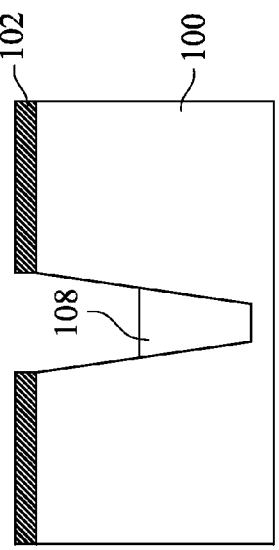

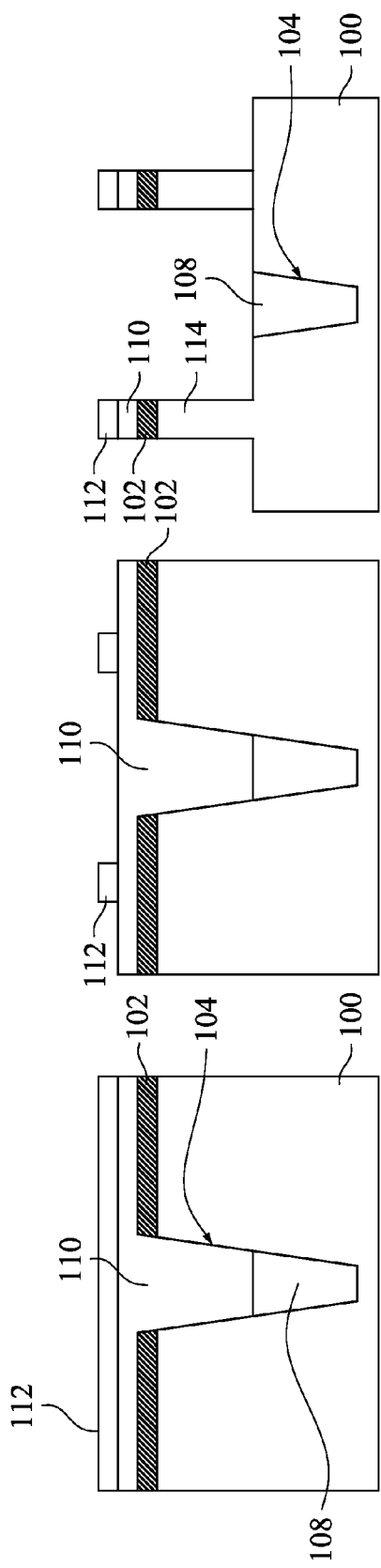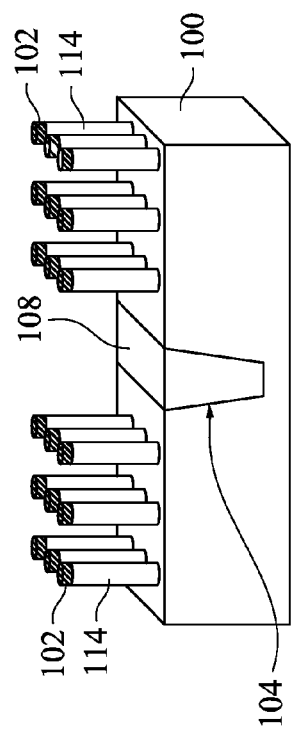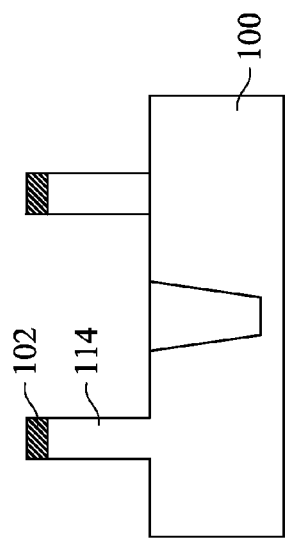

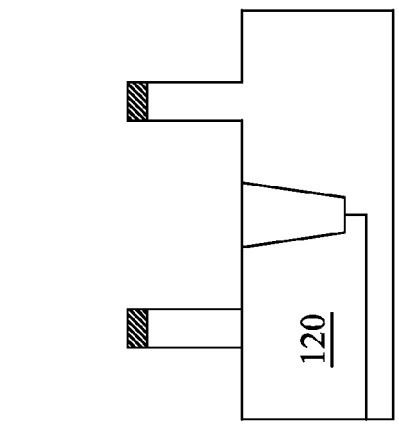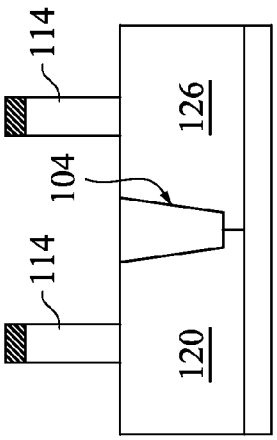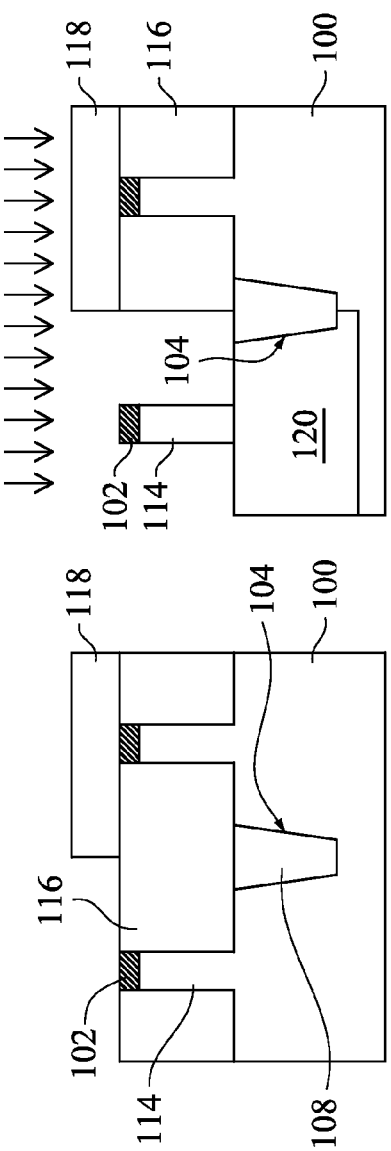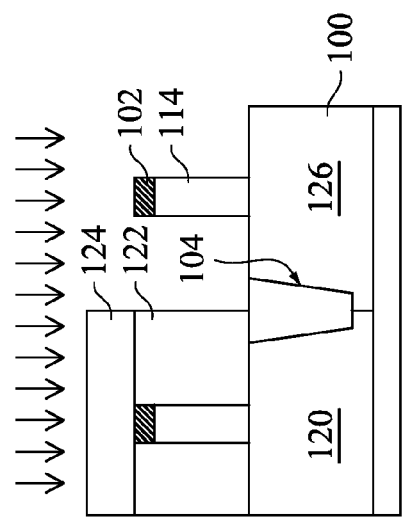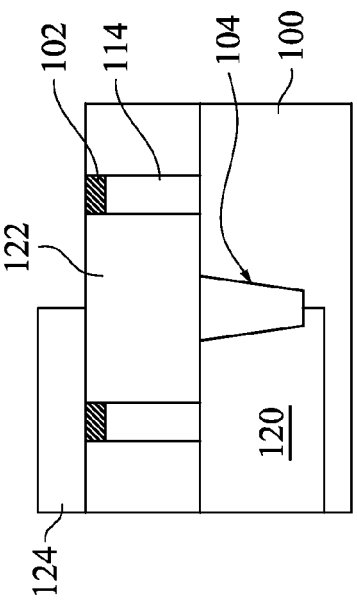
Fig. 11  Fig. 12  Fig. 13  Fig. 14  Fig. 15  Fig. 16

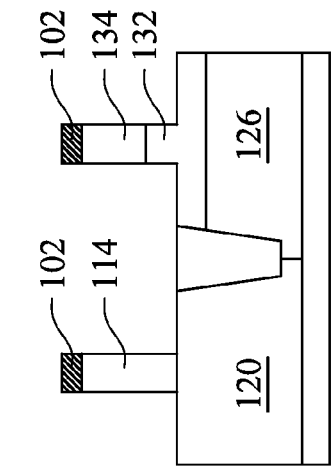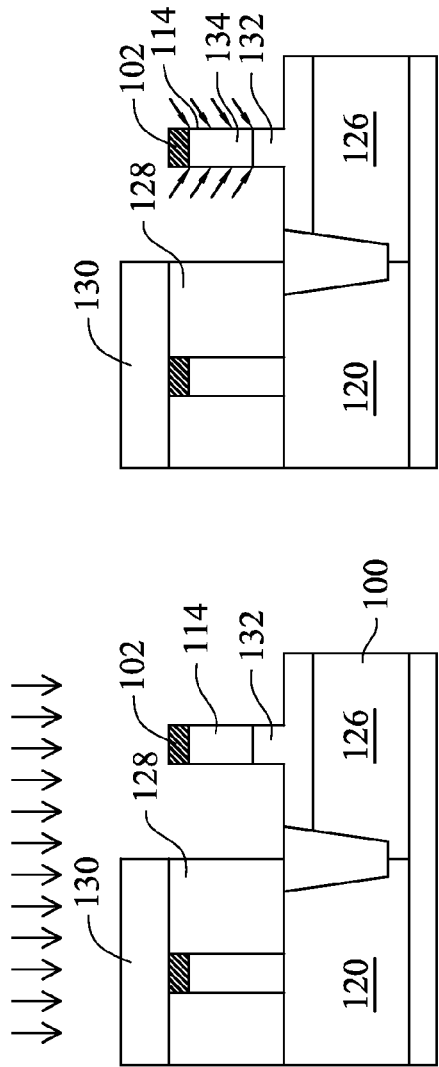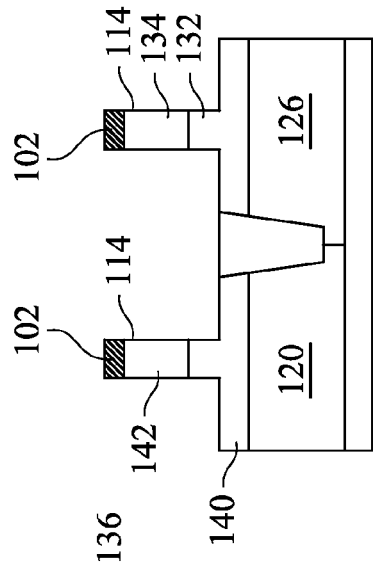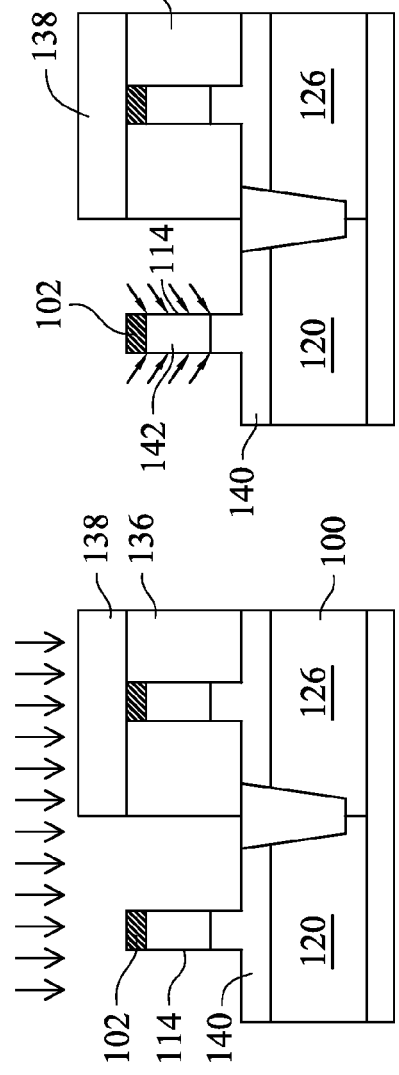

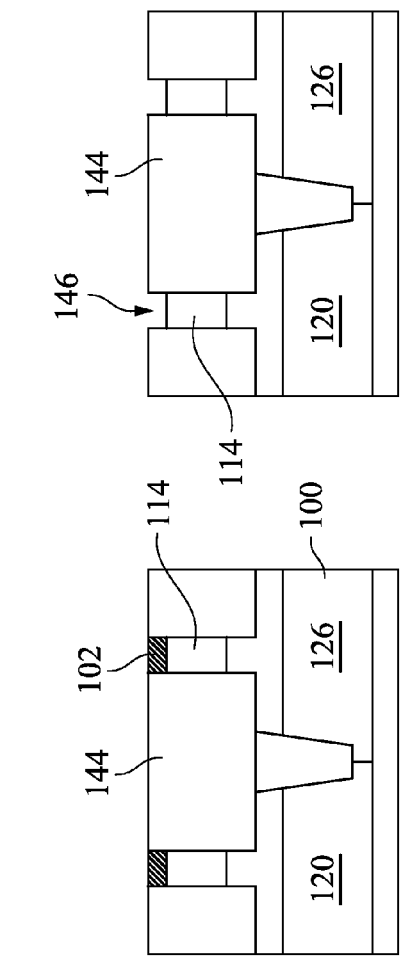
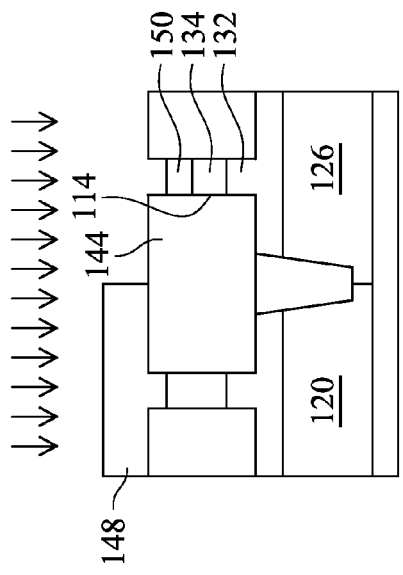
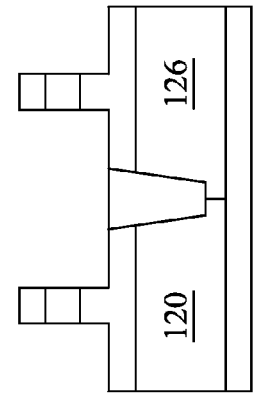
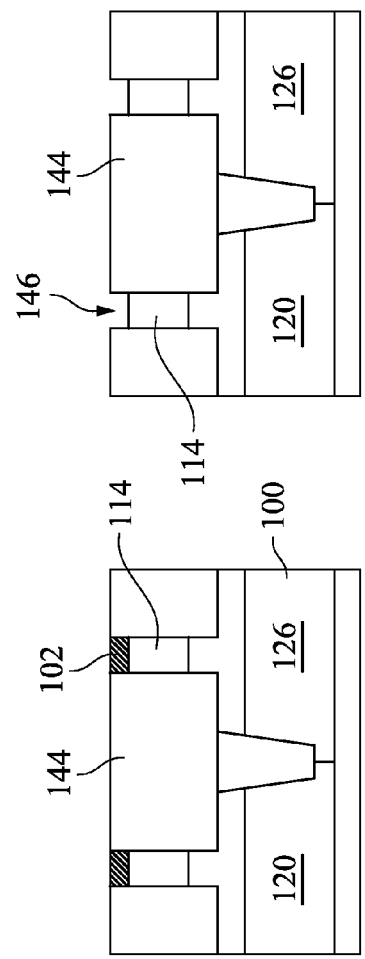
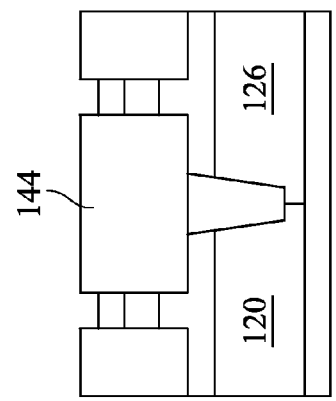
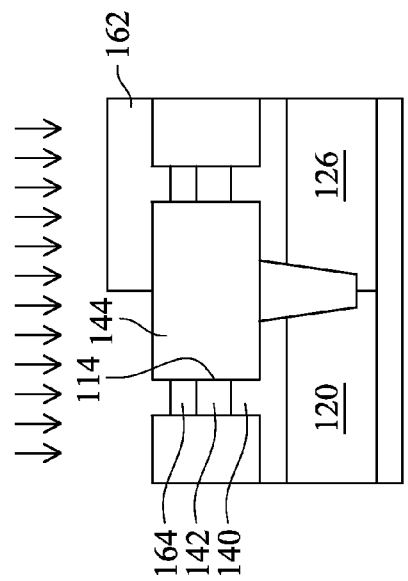

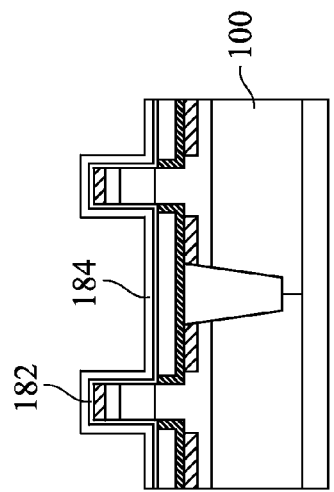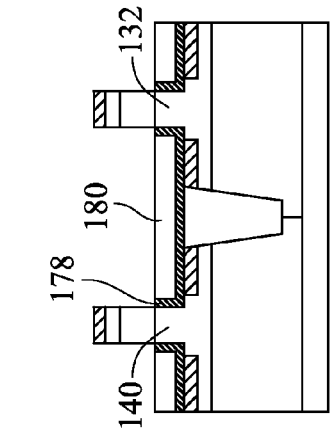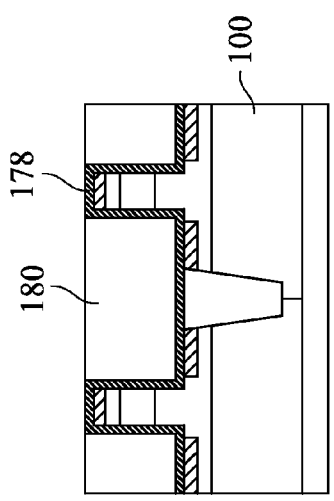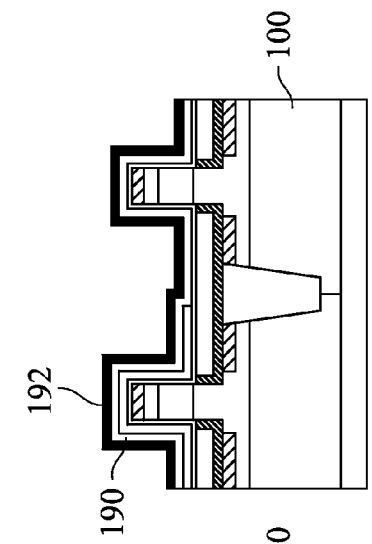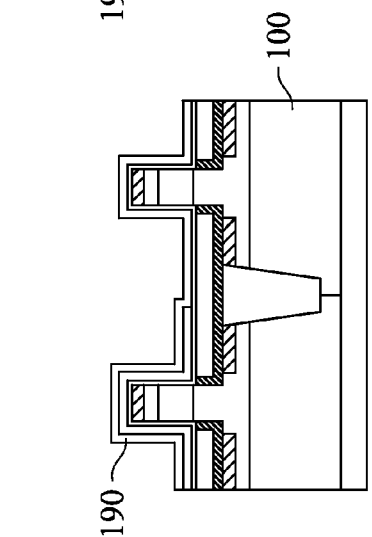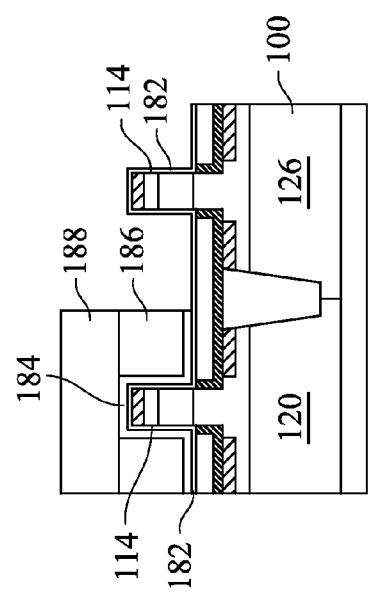

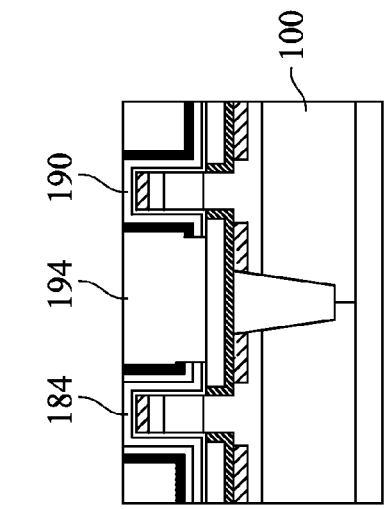
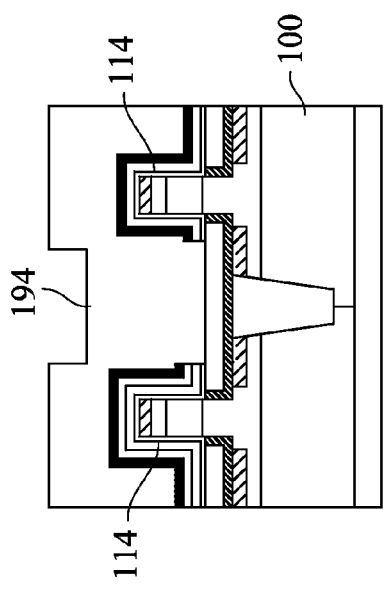
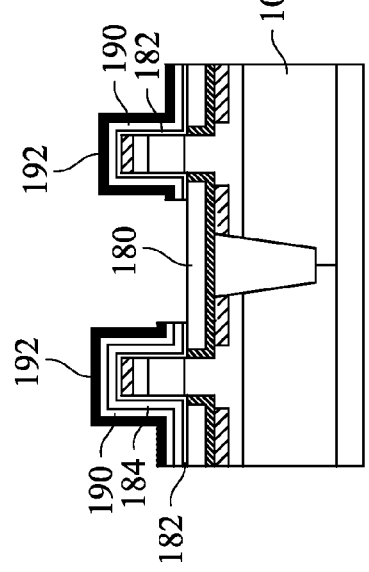
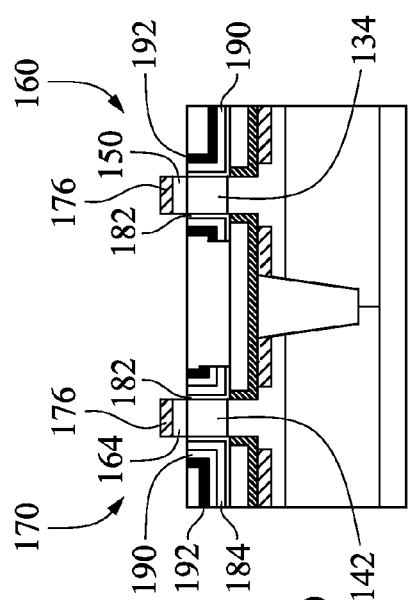
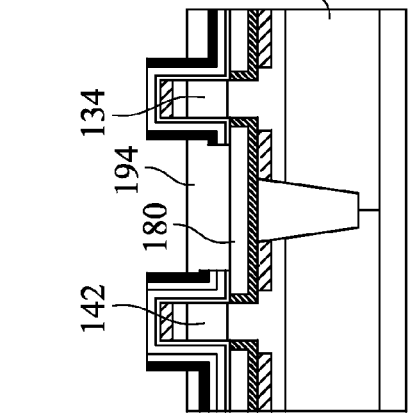

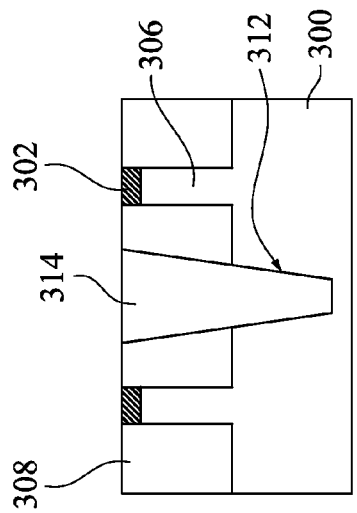
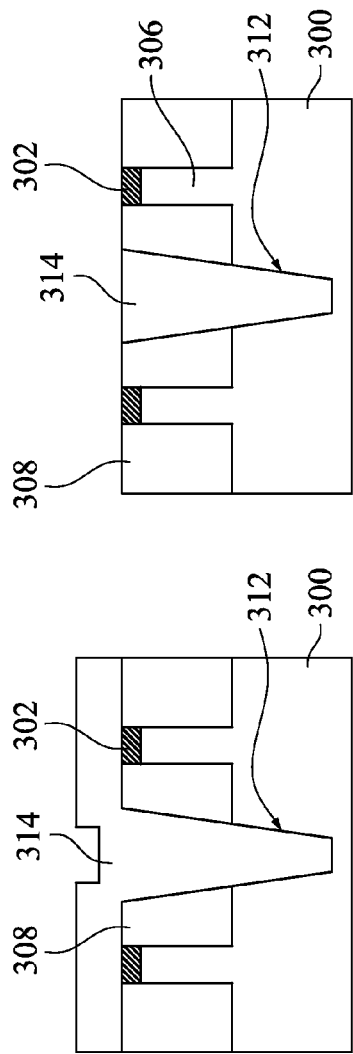
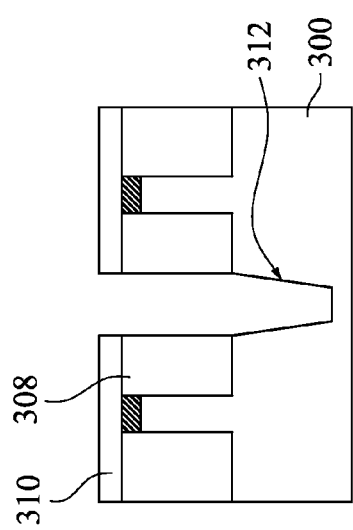
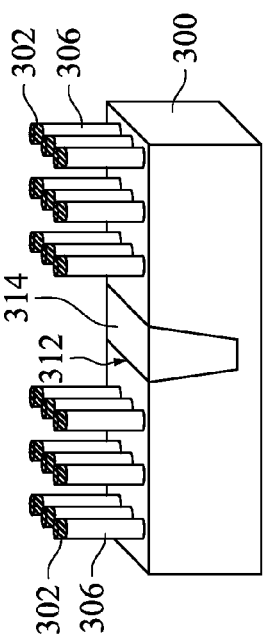
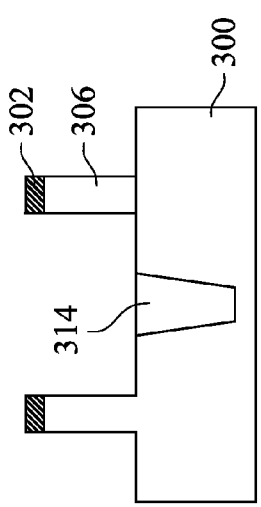

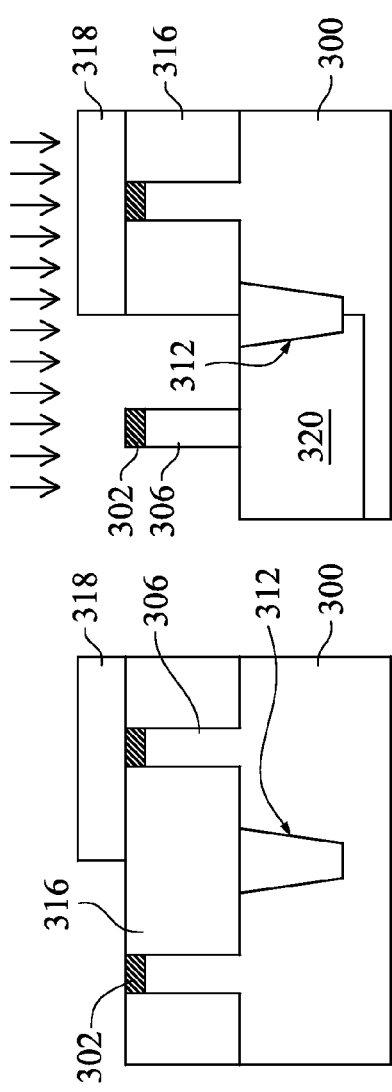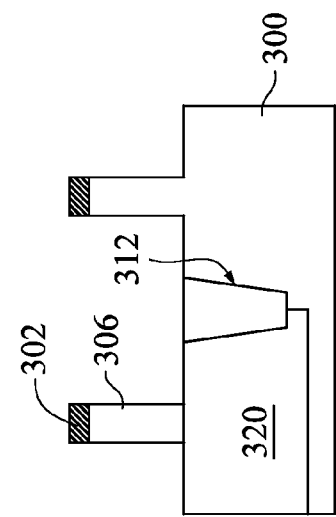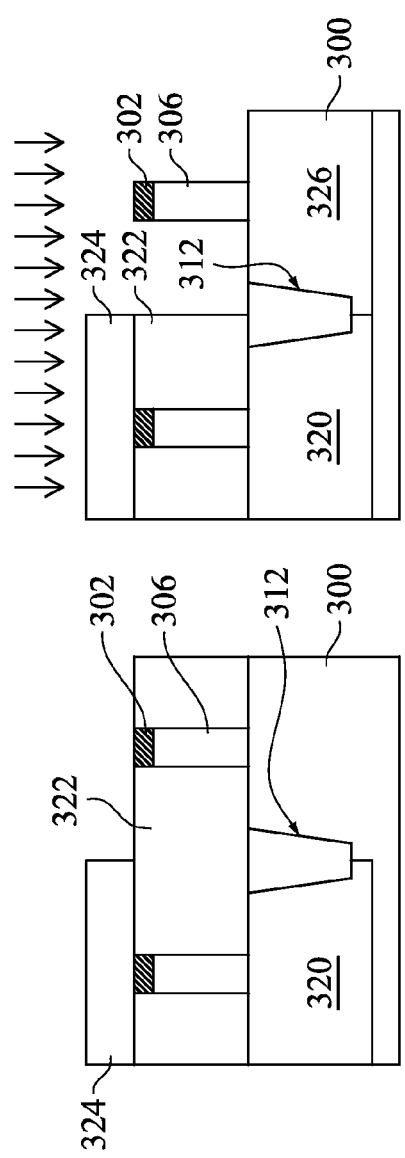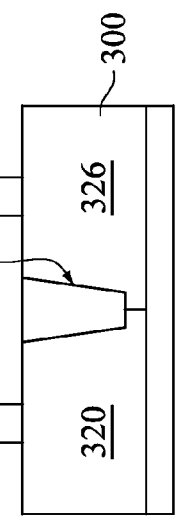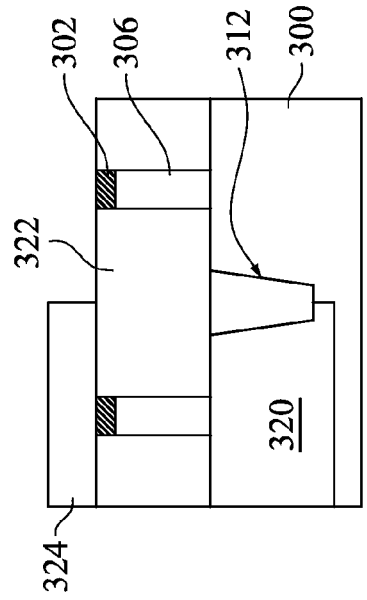

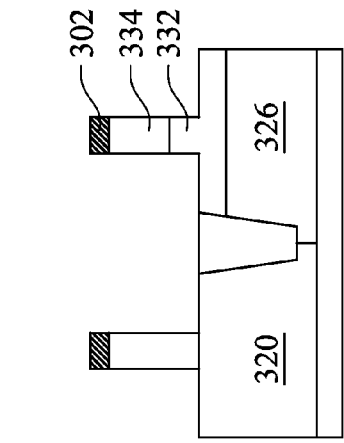
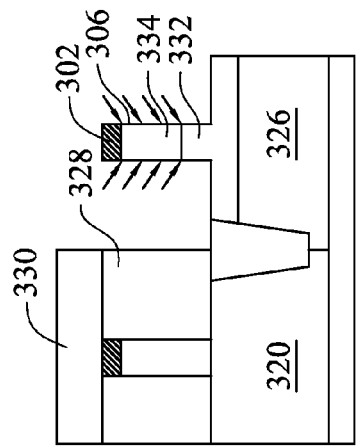
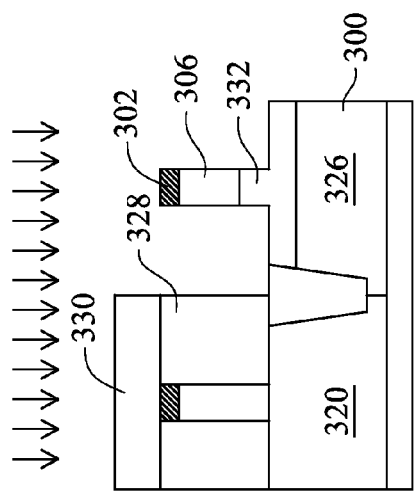
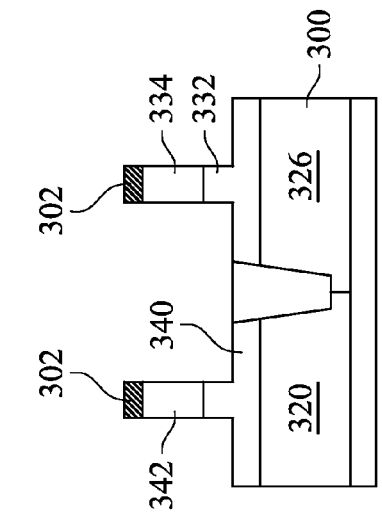
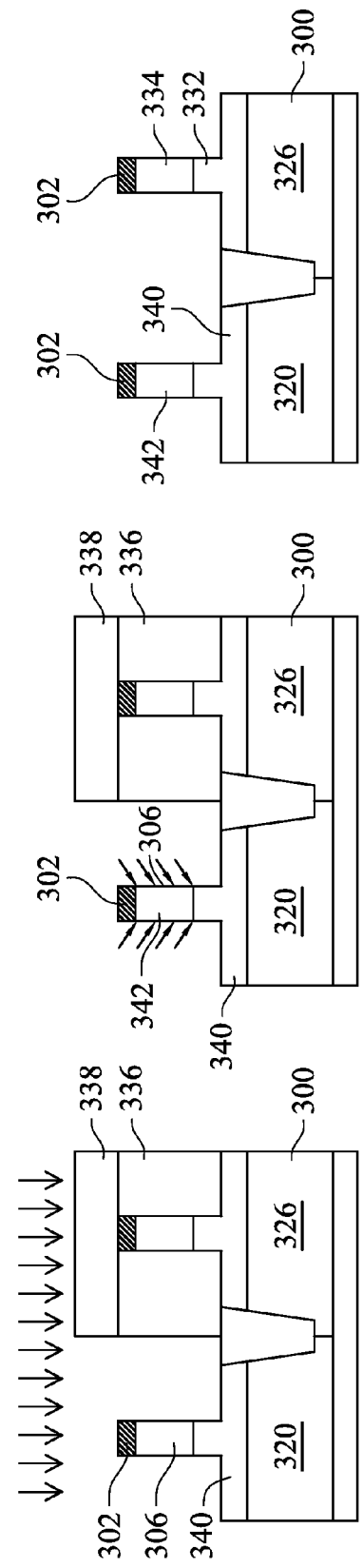

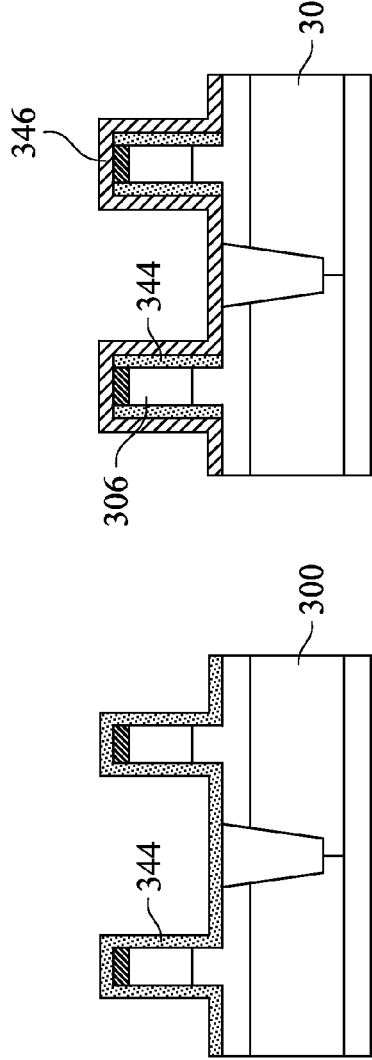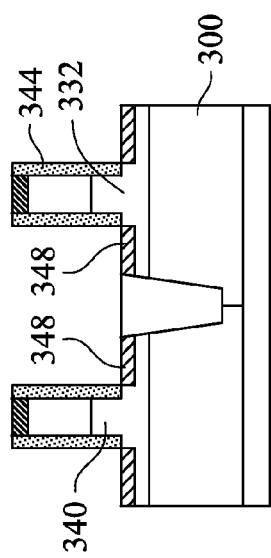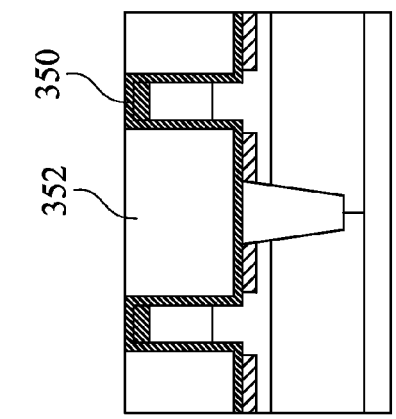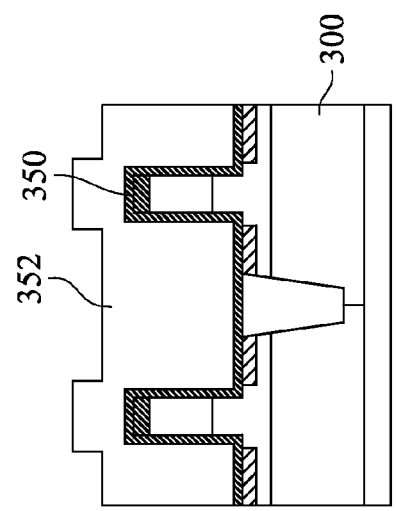

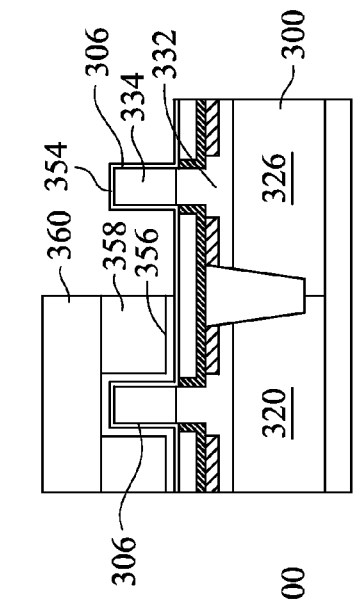
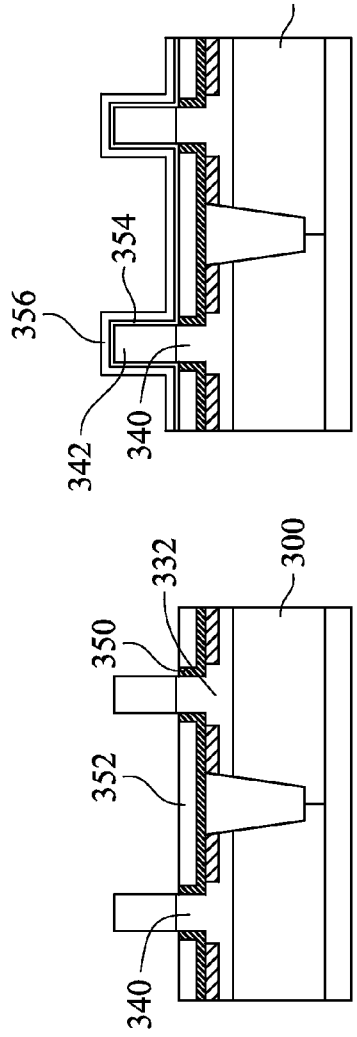
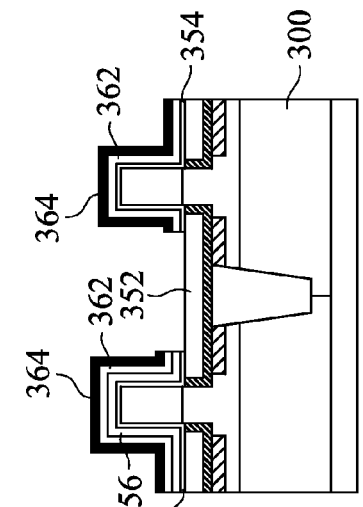
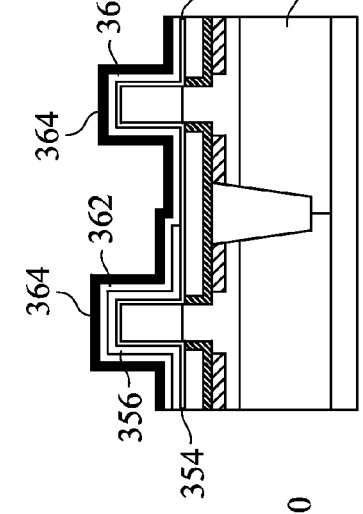
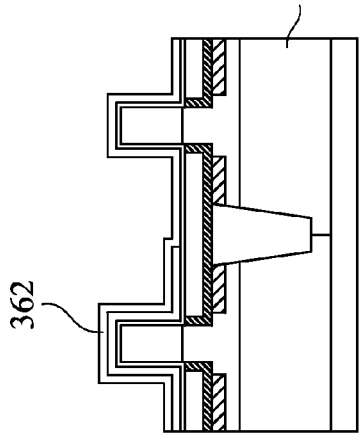

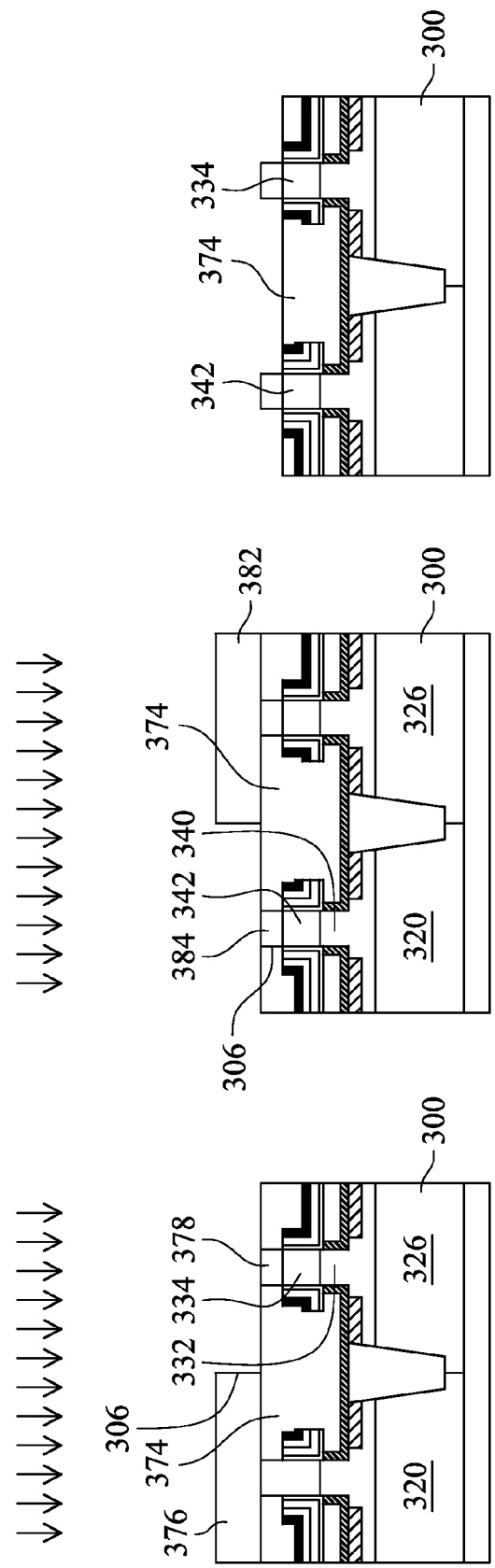

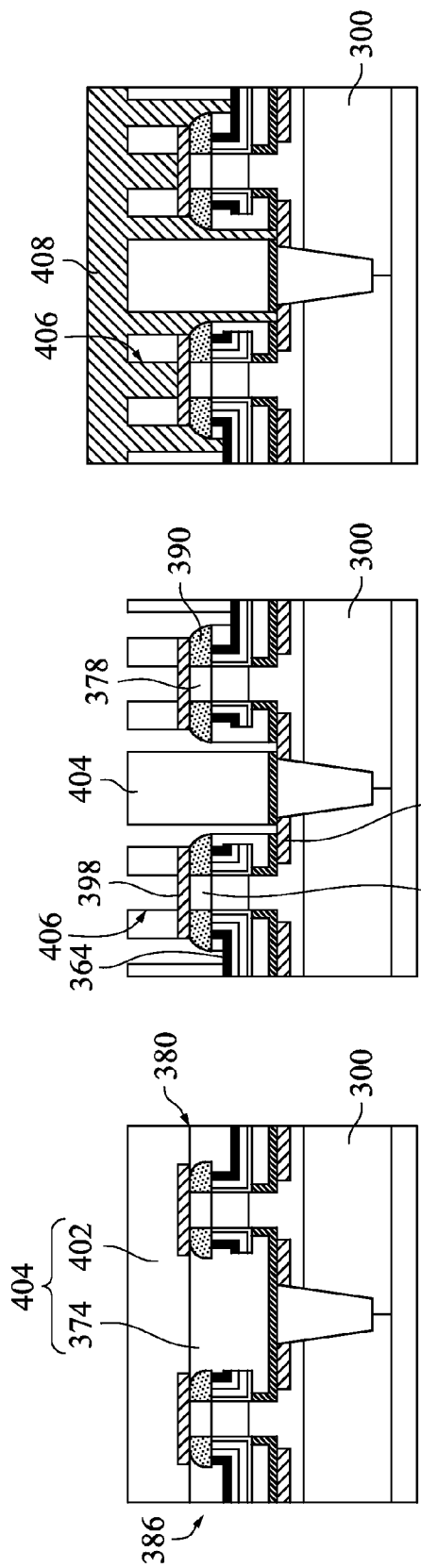

TUNNEL FIELD-EFFECT TRANSISTOR

RELATED APPLICATIONS

This application claims priority to U.S. Provisional Application Ser. No. 61/986,663, filed Apr. 30, 2014, which is herein incorporated by reference.

BACKGROUND

Metal-Oxide-Semiconductor (MOS) technology has been used widely. A MOS device can work in three regions including a linear region, a saturation region, and a sub-threshold region, depending on the gate voltage Vg and the source-drain voltage Vds. The sub-threshold region is a region where voltage Vg is smaller than the threshold voltage Vt. A parameter known as sub-threshold swing (SS) represents the easiness of switching the transistor current off, and is a factor in determining the speed of a MOS device. The sub-threshold swing can be expressed as a function of m*kT/q, where m is a parameter related to capacitance, k is the Boltzman constant, T is the absolute temperature, and q is the magnitude of the electrical charge on an electron. Previous studies have revealed that the sub-threshold swing of a typical MOS device has a limit of about 60 mV/decade at room temperature, which in turn sets a limit for further scaling of operational voltage VDD and threshold voltage Vt. This limitation is due to the diffusion transport mechanism of carriers. For this reason, existing MOS devices typically cannot switch faster than 60 mV/decade at room temperatures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 50 are cross-sectional views of different steps of a method for fabricating a tunnel field-effect transistor component, in accordance with some embodiments.

FIG. 51 to FIG. 108 are cross-sectional views of different steps of a method for fabricating a tunnel field-effect transistor component, in accordance with some embodiments.

DETAILED DESCRIPTION

Figure 29:
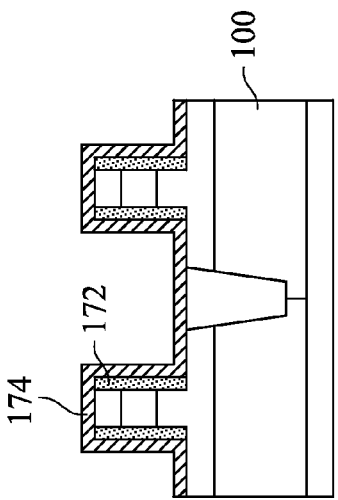

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly A tunnel field-effect transistor component having one or more tunnel field-effect transistors and a fabricating method thereof are provided in the following description. The tunnel field-effect transistor includes a high-k metal gate structure and thus has immunity to the short channel effect.

With reference to FIG. 1 to FIG. 50, which are cross-sectional views of different steps of a method for fabricating a tunnel field-effect transistor component in accordance with some embodiments, in portion or entirety, during various fabrication steps of the method. It is understood that additional steps can be provided before, during, and after the method, and some of the steps described below can be replaced or eliminated for additional embodiments of the method. It is further understood that additional features can be added in the tunnel field-effect transistor component, and some of the features described below can be replaced or eliminated, for additional embodiments of the tunnel field-effect transistor component.

Referring to FIG. 1, a hard mask layer 102 is formed on a substrate 100. The substrate 100 is a semiconductor substrate. The substrate 100 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The hard mask layer 102 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$).

Referring to FIG. 2, a trench 104 is formed. In order to form the trench 104, a mask layer 106 is formed on the substrate 100. The mask layer 106 is a photoresist layer. The mask layer 106 is patterned by a lithography process to form a plurality of features and a plurality of openings defined by the features on the hard mask layer 102. The pattern of the mask layer 106 is formed according to a predetermined integrated circuit pattern. The lithography process may include photoresist coating, exposing, post-exposure baking, and developing. Then, an etching process is performed to form the trench 104. The etching process is a dry etching process having a selectivity of nitride or oxynitride to oxide of about 1:10 at the openings and about 1:3-4 at the trench bottom. The mask layer 106 is removed after this step.

Referring to FIG. 3, a shallow trench isolation (STI) dielectric 108 is filled in the trench 104. The STI dielectric 108 is made of, for example, oxide. A portion of the STI dielectric 108 is deposited on the hard mask layer 102.

Referring to FIG. 4, the STI dielectric 108 is polished by, for example, chemical mechanical polishing (CMP) with a polish stop at the hard mask layer 102.

Referring to FIG. 5, the STI dielectric 108 is etched by a dry etching process.

Referring to FIG. 6, a barrier and anti-reflective coating (BARC) layer 110 is formed on the substrate 100. The BARC layer 110 has a thickness in a range from about 100 angstroms to about 500 angstroms. The BARC layer 110 is made of, for example, silicon oxynitride or an organic material. The BARC layer 110 can be formed by a deposition process, and the BARC layer 110 is optionally polished. Another mask layer 112 is formed on the BARC layer 110.

Referring to FIG. 7, the mask layer 112 is patterned by a lithography process to form a plurality of features and a plurality of openings defined by the features on the BARC layer 110.

Referring to FIG. 8, portions of the BARC layer 110, the hard mask layer 102, and the substrate 100 exposed by the patterned mask layer 112 is etched by, for example, a dry etching process. Therefore, a plurality of semiconductor wire structures 114 are formed on the substrate 100. In some embodiments, the dry etching process is stopped at the top of the STI dielectric 108, and therefore the STI dielectric 108 is exposed after the dry etching process.

Referring to FIG. 9, the mask layer 112 and the BARC layer 110 are removed from the structure shown in FIG. 8. The mask layer 112 and the BARC layer 110 can be removed by a wet etching process or a dry etching process. The substrate 100 is annealed. In the annealing process, a high temperature gas, such as hydrogen, is provided into a process chamber where the substrate 100 is annealed. In some embodiments, the semiconductor wire structures 114 are oxidized, and the oxide thereof is removed by stripping to thin the semiconductor wire structures 114. An oblique view of the substrate 100 after the annealing process is shown in FIG. 10, in which the semiconductor wire structures 114 are substantially vertically disposed on substrate 100.

Referring to FIG. 11, a BARC layer 116 is formed on the substrate 100, and the gaps between the semiconductor wire structures 114 are filled with the BARC layer 116. The BARC layer 116 is polished or etched back, so as to expose the hard mask layer 102 which is disposed on the semiconductor wire structure 114. Then, a mask layer 118, such as a photoresist layer, is formed on the BARC layer 116. The mask layer 118 is patterned by a lithography process to form features and openings defined by the features on the BARC layer 116, and a portion of the BARC layer 116 at a side of the trench 104 is exposed by the mask layer 118.

Referring to FIG. 12, the portion of the BARC layer 116 exposed by the mask layer 118 is removed by, for example, a wet etching process. A portion of the substrate 100 exposed from the BARC layer 116, the mask layer 118, and the hard mask layer 102 is doped with P-type or N-type dopants to form a P-well or an N-well. In some embodiments, the portion of the substrate 100 is doped with N-type dopants, such as P, As, Si, Ge, C, O, S, Se, Te, or Sb, to form an N-well 120 at a side of the trench 104. The mask layer 118 and the BARC layer 116 are removed after this step.

Referring to FIG. 13, after the mask layer and the BARC layer are removed, the N-well 120 is optionally annealed. The annealing process includes rapid thermal annealing (RTA), laser annealing processes, or other suitable annealing processes. Furthermore, some embodiments may include a "spike" annealing process that has a very short time duration.

Referring to FIG. 14, a BARC layer 122 is formed on the substrate 100, and the gaps between the semiconductor wire structures 114 are filled with the BARC layer 122. The BARC layer 122 is polished or etched back, so as to expose the hard mask layer 102 which is disposed on the semiconductor wire structure 114. A mask layer 124, such as a photoresist layer, is disposed on the BARC layer 122. The mask layer 124 is patterned by a lithography process to form features and openings defined by the features on the BARC layer 122, and a portion of the BARC layer 122 at another side of the trench 104 is exposed by the mask layer 124.

Referring to FIG. 15, the portion of the BARC layer 122 exposed by the mask layer 124 is etched by, for example, a wet etching process. A portion of the substrate 100 exposed from the BARC layer 122, the mask layer 124, and the hard mask layer 102 is doped with N-type or P-type dopants to form an N-well or a P-well. In some embodiments, the portion of the substrate 100 is doped with P-type dopants, such as B, BF2, Si, Ge, C, ZN, Cd, Be, Mg, or In, to form a P-well 126. The BARC layer 122 and the mask layer 124 are removed after this step.

Referring to FIG. 16, similarly, the P-well 126 is optionally annealed. The N-well 120 and the P-well 126 are formed on opposite sides of the trench 104, and the semiconductor wire structures 114 are respectively disposed on the N-well 120 and the P-well 126.

Referring to FIG. 17, a BARC layer 128 and a mask layer 130 are formed on the substrate 100, and the BARC layer 128 and the mask layer 130 are patterned to expose the P-well 126 and the semiconductor wire structure 114 on the P-well 126. An N-type implantation is performed to form an N-type drain region 132 on the P-well 126. N-type dopants are substantially vertically doped into the substrate 100 by the N-type implantation. Also, the N-type drain region 132 is optionally annealed. Some of the N-type dopants may diffuse into the bottom portion of the semiconductor wire structure 114 during the annealing process. Therefore, the bottom portion of the semiconductor wire structure 144 can be regarded as a part of the N-type drain region 132.

Referring to FIG. 18, the semiconductor wire structure 114 on the N-type drain region 132 is lightly doped with N-type dopants. Therefore, an N-type channel region 134 is formed on the N-type drain region 132. The doping concentration of the N-type channel region 134 is less than the doping concentration of the N-type drain region 132. Because the hard mask layer 102 covers the top surface of the semiconductor wire structure 114, the N-type dopants are doped into the semiconductor wire structure 114 via the side surface of the semiconductor wire structure 114. Namely, the N-type dopants are obliquely doped into the semiconductor wire structures 114. The BARC layer 128 and the mask layer 130 are removed after this step as shown in FIG. 19. Also, the N-type channel region 134 can be optionally annealed.

Referring to FIG. 20, a BARC layer 136 and a mask layer 138 are formed on the substrate 100, and the BARC layer 136 and the mask layer 138 are patterned to expose the N-well 120 and the semiconductor wire structure 114 on the N-well 120. A P-type implantation is performed to form a P-type drain region 140 on the N-well 120. P-type dopants are substantially vertically doped into the substrate 100 by the P-type implantation. Also, the P-type drain region 140 is optionally annealed. Some of the P-type dopants may diffuse into the bottom portion of the semiconductor wire structure 114 during the annealing process. Therefore, the bottom portion of the semiconductor wire structure 144 can be regarded as a part of the P-type drain region 140.

Referring to FIG. 21, the semiconductor wire structure 114 on the P-type drain region 140 is lightly doped with P-type dopants. Therefore, a P-type channel region 142 is formed on the P-type drain region 140. The doping concentration of the P-type channel region 142 is less than the doping concentration of the P-type drain region 140. Because the hard mask layer 102 covers the top surface of the semiconductor wire structure 114, the P-type dopants are doped into the semiconductor wire structure 114 via the side surface of the semiconductor wire structure 114. Namely, the P-type dopants are obliquely doped into the semiconductor wire structure 114. The BARC layer 136 and the mask layer 138 are removed after this step as shown in FIG. 22. Also, the P-type channel region 142 can be optionally annealed.

Referring to FIG. 23, an insulation layer 144 is formed on the substrate 100, and the insulation layer 144 is polished until it reaches the hard mask layer 102. The gaps between the semiconductor wire structures 114 are filled with the insulation layer 144. The insulation layer 144 can be formed by a deposition process. The insulation layer 144 is made of a dielectric material or an insulating material, such as silicon oxide or silicon nitride.

Referring to FIG. 24, the hard mask layer 102 (see FIG. 23) is removed by, for example, a stripping process. Therefore, a plurality of openings 146 are formed in the insulation layer 144, and the top of the semiconductor wire structures 114 are exposed by the insulation layer 144.

Referring to FIG. 25, a mask layer 148 is formed on the insulation layer 144. The mask layer 148 is patterned, and a portion of the mask layer 148 disposed above the P-well 126 is removed. The mask layer 148 can be a photoresist layer, and the mask layer 148 can be patterned by a lithography process. The semiconductor wire structure 114 disposed on the P-well 126 is exposed by the mask layer 148. Then, a P-type implantation is performed on the semiconductor wire structure 114 to form a P-type source region 150 on the N-type channel region 134. P-type dopants enter the semiconductor wire structure 114 via the top surface of the semiconductor wire structure 114. The N-type drain region 132, the N-type channel region 134, and the P-type source region 150 are substantially vertically stacked. The doping concentration of the P-type source region 150 is greater than the doping concentration of the N-type drain region 132, such that the current can go through the N-type channel region 134 more easily. The P-type source region 150 and/or the N-type drain region 132 has a doping concentration in a range from about $1*10^{18}$ atoms/cm$^3$ to about $1*10^{22}$ atoms/cm$^3$. The N-type channel region 134 has a doping concentration in a range from about $1*10^{12}$ atoms/cm$^3$ to about $1*10^{18}$ atoms/cm$^3$. After the P-type source region 150 is formed, the mask layer 148 is removed.

Referring to FIG. 26, a mask layer 162 is formed on the insulation layer 144. The mask layer 162 is patterned, and a portion of the mask layer 162 disposed above N-well 120 is removed. The mask layer 162 can be a photoresist layer, and the mask layer 162 can be patterned by a lithography process. The semiconductor wire structure 114 disposed on the N-well 120 is exposed by the mask layer 162. Then, an N-type implantation is performed on the semiconductor wire structure 114 to form an N-type source region 164 on the P-type channel region 142. N-type dopants enter the semiconductor wire structure 114 via the top surface of the semiconductor wire structure 114. The P-type drain region 140, the P-type channel region 142, and the N-type source region 164 are substantially vertically stacked. The doping concentration of the N-type source region 164 is greater than the doping concentration of the P-type drain region 140, such that the current can go through the P-type channel region 142 more easily. The N-type source region 164 and/or the P-type drain region 140 has a doping concentration in a range from about $1*10^{18}$ atoms/cm$^3$ to about $1*10^{22}$ atoms/cm$^3$. The P-type channel region 142 has a doping concentration in a range from about $1*10^{12}$ atoms/cm$^3$ to about $1*10^{18}$ atoms/cm$^3$. After the N-type source region 164 is formed, the mask layer 162 is removed.

Referring to FIG. 27, one or more annealing processes are performed to diffuse and activate the source and drain regions. Because the source regions, the channel regions and the drain regions are formed by the implantation process, so that at least one of the source regions, the channel regions and the drain regions has a graded doping concentration.

After the one or more annealing processes are performed, the insulation layer 144 is removed as shown in FIG. 28. The insulation layer 144 is removed by, for example, a wet etching process.

Referring to FIG. 29, a spacer layer 172 is formed on the substrate 100. The spacer layer 172 is formed by, for example, a deposition process. The spacer layer 172 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide (SiO$_2$).

Figure 30:
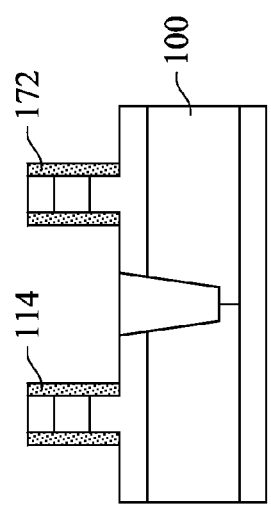

Referring to FIG. 30, the spacer layer 172 is patterned by a dry etching process to expose the substrate 100 and the semiconductor wire structures 114.

Figure 31:
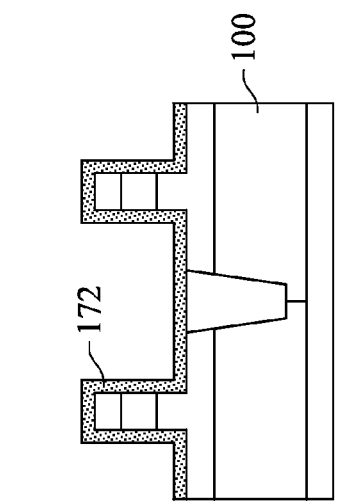

Referring to FIG. 31, a metal layer 174 is formed on the substrate 100. In some embodiments, the metal layer 174 is deposited on the substrate 100. The metal layer 174 is made of, for example, Ti, Co, Ni, NiCo, Pt, NiPt, Er, or Yb. In some embodiments, a cap layer is optionally formed on the metal layer 174. The cap layer is made of, for example, titanium nitride.

Figure 32:
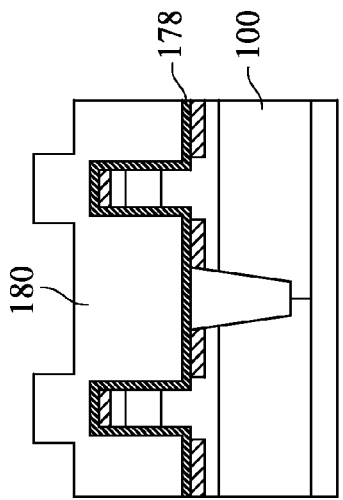
Figure 33:
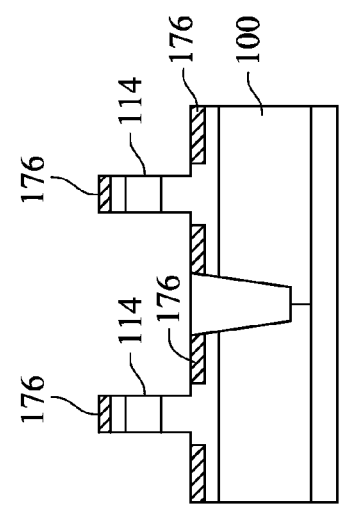

Referring to FIG. 32, one or more annealing processes are performed in a silicidation process. The material of the substrate 100 contains silicon. Therefore, portions of the substrate 100 and the semiconductor wire structures 114 in contact with the metal layer react with the metal layer and become silicide regions 176 after the silicidation process. The silicide regions 176 are formed on the P-type drain region 140, the N-type source region 164, the N-type drain region 132, and the P-type source region 150. The remaining metal layer is removed after the silicide regions 176 are formed. The remaining metal layer can be removed by, for example, a wet stripping process. Also, the remaining spacer layer 172 is removed after the silicide regions 176 are formed, as shown in FIG. 33.

Figure 34:
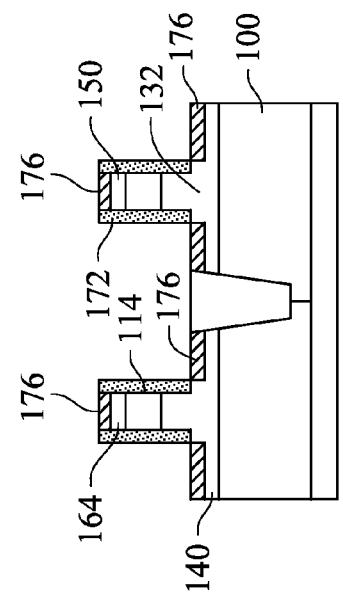

Referring to FIG. 34, an etch stop layer 178 is formed on the substrate 100, and an insulation layer 180 is formed on the etch stop layer 178. The etch stop layer 178 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide (SiO$_2$). The insulation layer 180 is made of a dielectric material or an insulating material, such as silicon oxide or silicon nitride.

Referring to FIG. 35, the insulation layer 180 is polished by, for example, a CMP process. The process of polishing the insulation layer 180 is stopped on the etch stop layer 178.

Referring to FIG. 36, portions of the etch stop layer 178 and the insulation layer 180 are removed. The etch stop layer 178 and the insulation layer 180 are removed by one or more dry etching processes. The portions of the etch stop layer 178 and the insulation layer 180 above the P-type drain region 140 and the N-type drain region 132 are removed. The remaining insulation layer 180 can be regarded as a bottom insulation layer.

Referring to FIG. 37, a high-k (HK) dielectric layer 182 and a P-type work function layer 184 are formed on the substrate 100. An interfacial layer (IL) is optionally formed between the high-k dielectric layer 182 and the substrate 100. The interfacial layer is made of, for example, silicon oxide ($SiO_2$), HfSiO, SiON, or combinations thereof. In some embodiments, the interfacial layer includes a chemical SiO2 layer with hydroxyl groups. With hydroxyl groups on the surface of the interfacial layer, the quality of subsequent growing high-k dielectric layer 182 is enhanced.

The high-k dielectric layer 182 is formed over the interfacial layer by atomic layer deposition (ALD), chemical vapor deposition (CVD), metal organic CVD (MOCVD), physical vapor deposition (PVD), thermal oxidation, or combinations thereof. The high-k dielectric layer 182 is, for example, a binary or ternary high-k film, such as HfOx. Alternatively, the high-k dielectric layer 182 is made of a high-k dielectric, such as LaO, AlO, ZrO, $ZrO_2$, TiO, $Ta_2O_5$, $Y_2O_3$, $SrTiO_3$ (STO), $BaTiO_3$ (BTO), BaZrO, HfZrO, $HfZrO_2$, HfLaO, HfSiO, LaSiO, $La_2O_3$, AlSiO, $TiO_2$, HfTaO, HfTiO, $HfO_2$, $(Ba,Sr)TiO_3$ (BST), $Al_2O_3$, $Si_3N_4$, oxynitrides, or combinations thereof.

The P-type work function layer 184 is made of, for example, TiN, W, Ta, Ni, Pt, Ru, Mo, Al, WN, or combinations thereof.

Referring to FIG. 38, a BARC layer 186 and a mask layer 188 are formed on the substrate 100 and are patterned. The semiconductor wire structures 114 above the N-well 120 is covered by the BARC layer 186 and the mask layer 188 while portions of the BARC layer 186 and the mask layer 188 above the P-well 126 are removed. A portion of the P-type work function layer 184 above the P-well 126 is removed. After the portion of the P-type work function layer 184 is removed, the BARC layer 186 and the mask layer 188 are also removed.

Referring to FIG. 39, an N-type work function layer 190 is formed on the substrate 100. The N-type work function layer 190 is made of, for example, Ti, Ag, Al, TiAlMo, Ta, TaN, TiAlC, TiAlN, TaC, TaCN, TaSiN, Mn, Zr, or combinations thereof.

Referring to FIG. 40, a metal gate layer 192 is formed on the substrate 100. The metal gate layer 192 is deposited on the N-type work function layer 190 by ALD, PVD, CVD, or other processes. The metal gate layer 192 is made of, for example, Al, W, Co, or Cu.

Referring to FIG. 41, portions of the metal gate layer 192, the N-type work function layer 190, the P-type work function layer 184, and the high-k dielectric layer 182 above the STI dielectric 108 are removed by, for example, a dry etching process. The dry etching process is stopped on the bottom insulation layer 180.

Referring to FIG. 42, an insulation layer 194 is formed on the substrate 100. The gaps between the semiconductor wire structures 114 are filled with the insulation layer 194.

Referring to FIG. 43, the insulation layer 194 is polished by, for example, a CMP process. The insulation layer 194 is polished, and the polish process is stopped on the N-type work function layer 190 and the P-type work function layer 184.

Referring to FIG. 44, the insulation layer 194 is etched by a dry etching or wet etching process. A portion of the insulation layer 194 above the STI dielectric 108 is removed. The remaining insulation layer 194 can be regarded as a middle insulation layer, which is disposed on the bottom insulation layer 180. The middle insulation layer 194 and the bottom insulation layer 180 are made of the same dielectric material. The top surface of the middle insulation layer 194 is substantially level with the top surface of the channel regions 134 and 142.

Referring to FIG. 45, top portions of the metal gate layer 192, the N-type work function layer 190, the P-type work function layer 184, and the high-k dielectric layer 182 are removed by a dry etching or wet etching process to expose the P-type source region 150, the N-type source region 164, and the silicide regions 176 thereon. The metal gate layer 192 is disposed around the N-type channel region 134 and the P-type channel region 142, and the high-k dielectric layer 182 is disposed between the metal gate layer 192 and the channel regions 134, 142. After this step, an N-type tunnel field-effect transistor 160 and a P-type tunnel field-effect transistor 170 with vertical gate all around (VGAA) structures are formed.

Figure 46:
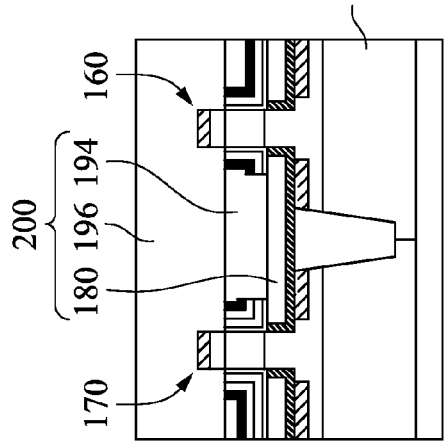

Referring to FIG. 46, an insulation layer 196 is formed on the substrate 100 and is polished. The top surface of the insulation layer 196 is higher than the top surface of the N-type tunnel field-effect transistor 160 and the P-type tunnel field-effect transistor 170. The remaining insulation layer 196 can be regarded as a top insulation layer, which is disposed on the middle insulation layer 194. The top insulation layer 196, the middle insulation layer 194, and the bottom insulation layer 180 are regarded as an insulation layer 200 hereafter. The N-type tunnel field-effect transistor 160 and the P-type tunnel field-effect transistor 170 are isolated by the insulation layer 200.

Figure 47:
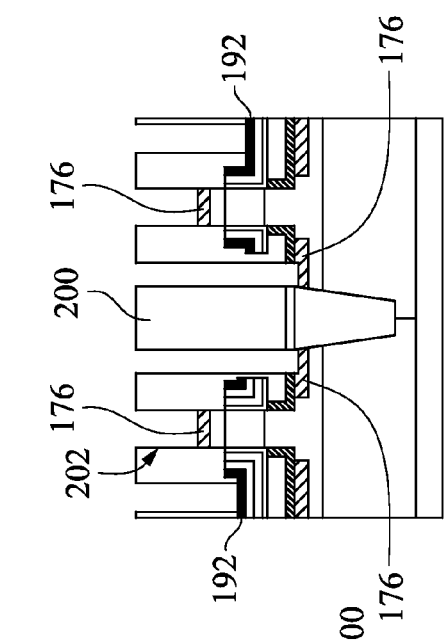

Referring to FIG. 47, the insulation layer 200 is patterned, and a plurality of openings 202 are formed in the insulation layer 200. The openings 202 lead to the metal gate layer 192 and the silicide regions 176 on the drain or source regions, respectively. In some embodiments, the openings 202 are formed by a dry etching process.

Figure 48:
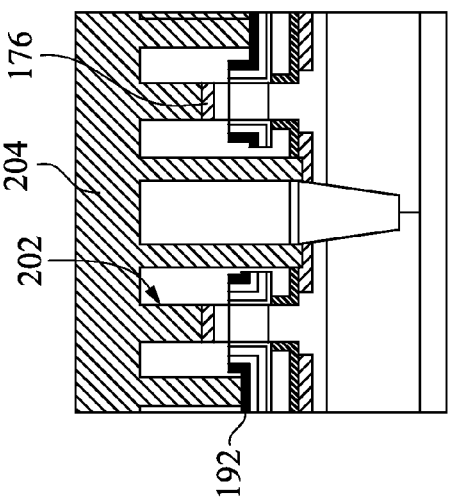

Referring to FIG. 48, a conductive material 204 is deposited, and the openings 202 are filled with the conductive material 204. The conductive material 204 is made of, for example, W, Co, Al, or Cu. Then, the conductive material 204 is polished by, for example, a CMP process.

Figure 49:
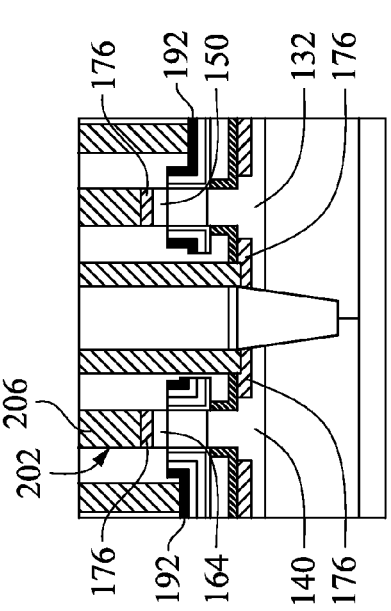

Referring to FIG. 49, a plurality of contact structures 206 are formed in the openings 202 after the conductive material is polished. Some of the contact structures 206 are connected to the metal gate layer 192, and others are connected to the silicide regions 176. The contact structures 206 are connected to the drain or source regions 132, 140, 150 and 164 via the silicide regions 176.

Figure 50:
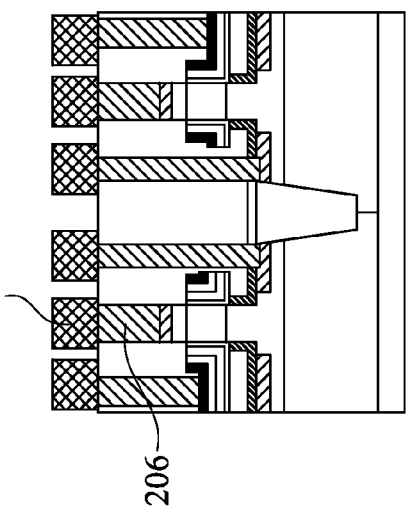

Referring to FIG. 50, a plurality of electrodes 208 are formed on the contact structures 206 respectively for later interconnection, such as a back end of line (BEOL) process. The electrodes 208 include gate electrodes, source electrodes, and drain electrodes. The electrodes 208 is made of, for example, Cu, Co, or other metal.

As described above, the tunnel field-effect transistor component including one or more tunnel field-effect transistors with high-k metal gate is provided. However, the tunnel field-effect transistors may be fabricated by other possible processes, for example, the act of forming the shallow trench isolation can be performed before or after the act of forming the semiconductor wire structures; the act of source implantation can be performed before or after the act of forming the metal gate structure.

Figure 51:
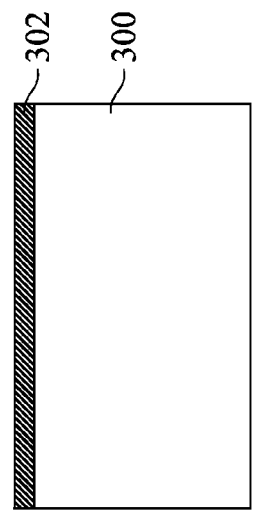

With reference to FIG. 51 to FIG. 108, which show cross-sectional views of different steps of the method for fabricating the tunnel field-effect transistor component in accordance with some embodiments. It is understood that additional steps can be provided before, during, and after the method, and some of the steps described below can be replaced or eliminated, for additional embodiments of the method. It is further understood that additional features can be added in the tunnel field-effect transistor component, and some of the features described below can be replaced or eliminated, for additional embodiments of the tunnel field-effect transistor component.

Referring to FIG. 51, a hard mask layer 302 is formed on a substrate 300. The substrate 300 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The hard mask layer 302 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide (SiO2).

Figure 52:
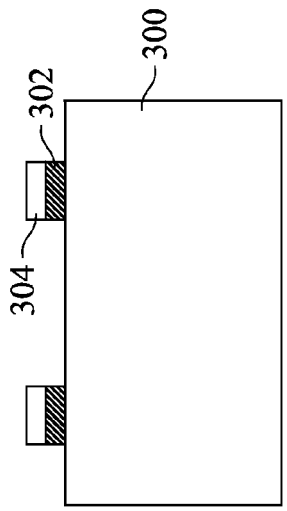

Referring to FIG. 52, a mask layer 304 is formed on the hard mask layer 302. The mask layer 304 is a photoresist layer. The mask layer 304 is patterned by a lithography process and forms a plurality of features and a plurality of openings defined by the features on the hard mask layer 302. The pattern of the mask layer 304 is formed according to a predetermined integrated circuit pattern. The lithography process may include photoresist coating, exposing, post-exposure baking, and developing. Then, the hard mask layer 302 is etched, and the portion of the hard mask layer 302 exposed by the mask layer 304 is removed. The mask layer 304 is removed after the hard mask layer 302 is patterned.

Figure 53:
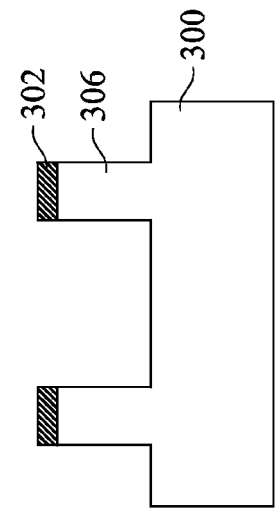

Referring to FIG. 53, the portion of the substrate 300 exposed by the hard mask layer 302 is removed, for example, by an etching process. Therefore, a plurality of semiconductor wire structures 306 are formed on the substrate 300.

Figure 54:
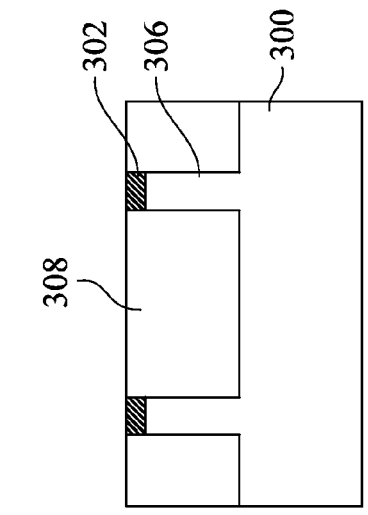

Referring to FIG. 54, the substrate 300 is annealed. In the anneal process, a high temperature gas, such as hydrogen, is provided into a process chamber where the substrate 300 is annealed. In some embodiments, the semiconductor wire structures 306 are oxidized, and the oxide thereof is removed by stripping to thin the semiconductor wire structures 306.

Figure 55:
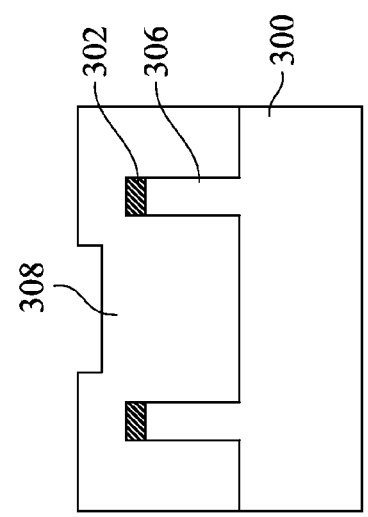

Referring to FIG. 55, a barrier and anti-reflective coating (BARC) layer 308 is formed on the substrate 300. The BARC layer 308 has a thickness in a range from about 100 angstroms to about 500 angstroms. The BARC layer 308 is a silicon oxynitride or an organic material. The BARC layer 308 can be formed by a deposition process, and the gaps between the semiconductor wire structures 306 are filled with the BARC layer 308.

Figure 56:
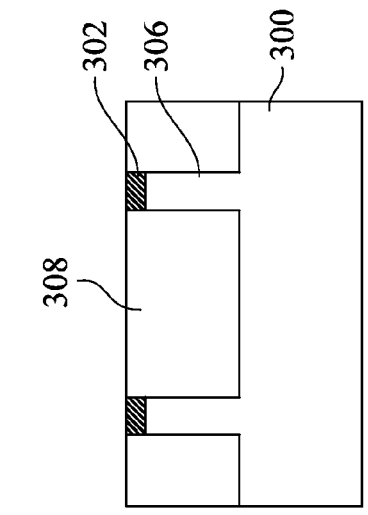

Referring to FIG. 56, the BARC layer 308 is polished by, for example, a chemical mechanical polishing (CMP) with a polish stop at the hard mask layer 302.

Referring to FIG. 57, a mask layer 310 is formed on the BARC layer 308 and is patterned by a lithography process. An etching process is performed to form a trench 312 in the substrate 300. The etching process is a dry etching process having a selectivity of nitride or oxynitride to oxide of about 1:10 at the openings and about 1:3-4 at the trench bottom. The mask layer 310 is further removed after this step.

Referring to FIG. 58, a shallow trench isolation (STI) dielectric 314 is filled in the trench 312. The STI dielectric 314 is made of, for example, oxide. A portion of the STI dielectric 314 is deposited on the hard mask layer 302 and on the BARC layer 308.

Referring to FIG. 59, the STI dielectric 314 is polished by, for example, chemical mechanical polishing (CMP) with a polish stop at the hard mask layer 302.

Referring to FIG. 60, the STI dielectric 314 is further etched with a dry etching process. The STI dielectric 314 is etched to a predetermined depth. In some embodiments, the gap-filling oxide layer 314 between the semiconductor wire structures 306 is removed. An oblique view of the substrate 300 is shown in FIG. 61. A plurality of semiconductor wire structures 306 are formed on the substrate 300, and the trench 312 is formed between the semiconductor wire structures 306. The semiconductor wire structures 306 are substantially vertically disposed on the substrate 300.

Referring to FIG. 62, a BARC layer 316 is formed on the substrate 300, and the gaps between the semiconductor wire structures 306 are filled with the BARC layer 316. The BARC layer 316 is polished or etched, so as to expose the hard mask layer 302, which is disposed on the semiconductor wire structure 306. Then, a mask layer 318, such as a photoresist layer, is formed on the BARC layer 316. The mask layer 318 is further patterned by a lithography process and forms features and openings defined by the features on the BARC layer 316, and a portion of the BARC layer 316 at a side of the trench 312 is exposed by the mask layer 318.

Referring to FIG. 63, the portion of the BARC layer 316 exposed by the mask layer 318 is removed by, for example, a wet etching process. A portion of the substrate 300 exposed from the BARC layer 316. The mask layer 318 and the hard mask layer 302 are doped with P-type or N-type dopants to form a P-well or an N-well. In some embodiments, the portion of the substrate 300 is doped with N-type dopants, such as P, As, Si, Ge, C, O, S, Se, Te, or Sb, to form an N-well 320 at a side of the trench 312. The mask layer 318 and the BARC layer 316 are removed after this step.

Referring to FIG. 64, after the mask layer and the BARC layer are removed, The N-well 320 is optionally annealed. The annealing process includes rapid thermal annealing (RTA), laser annealing processes, or other annealing processes.

Referring to FIG. 65, a BARC layer 322 is formed on the substrate 300, and the gaps between the semiconductor wire structures 306 are filled with the BARC layer 322. The BARC layer 322 is polished or etched, so as to expose the hard mask layer 302, which is disposed at the semiconductor wire structure 306. The mask layer 324, such as a photoresist layer, is disposed on the BARC layer 322. The mask layer 324 is patterned and forms the features and openings on the BARC layer 322, and a portion of the BARC layer 322 is exposed by the mask layer 324.

Referring to FIG. 66, the portion of the BARC layer 322 exposed by the mask layer 324 is removed by, for example, a wet etching process. A portion of the substrate 300 exposed from the BARC layer 322 and the mask layer 324 is doped with N-type or P-type dopants to form an N-well or a P-well. In some embodiments, the portion of the substrate 300 is doped with P-type dopants, such as B, $BF_2$, Si, Ge, C, ZN, Cd, Be, Mg, or In, to form a P-well 326 at another side of the trench 312. The BARC layer 322 and the mask layer 324 are removed after this step.

Referring to FIG. 67, similarly, the P-well 326 is optionally annealed. The N-well 320 and the P-well 326 are formed on opposite sides of the trench 312, and the semiconductor wire structures 306 are respectively disposed on the N-well 320 and the P-well 326.

Referring to FIG. 68, a BARC layer 328 and a mask layer 330 are formed on the substrate 300, and the BARC layer 328 and the mask layer 330 are patterned to expose the P-well 326 and the semiconductor wire structure 306 disposed on the P-well 326, in which the semiconductor wire structure 306 is covered by the hard mask layer 302. An N-type implantation is performed to form an N-type drain region 332 on the P-well 326. N-type dopants are substantially vertically doped into the substrate 300. Also, the N-type drain region 332 is optionally annealed. Some of the N-type dopants may diffuse into the bottom portion of the semiconductor wire structure 306 during the annealing process. Therefore, the bottom portion of the semiconductor wire structure 306 can be regarded as a part of the N-type drain region 332.

Referring to FIG. 69, the semiconductor wire structure 306 on the N-type drain region 332 is lightly doped with N-type dopants. Therefore, an N-type channel region 334 is formed on the N-type drain region 332. The doping concentration of the N-type channel region 334 is less than the doping concentration of the N-type drain region 332. Because the hard mask layer 302 covers the top surface of the semiconductor wire structure 306, the N-type dopants are doped into the semiconductor wire structure 306 via the side surface of the semiconductor wire structure 306. Namely, the N-type dopants are obliquely doped into the semiconductor wire structure 306. The BARC layer 328 and the mask layer 330 disposed are removed after this step, as shown in FIG. 70. Also, the N-type channel region 334 is optionally annealed.

Referring to FIG. 71, a BARC layer 336 and a mask layer 338 are formed on the substrate 300, and the BARC layer 336 and the mask layer 338 are patterned to expose the N-well 320 and the semiconductor wire structure 306 disposed on the N-well 320, in which the semiconductor wire structure 306 is covered by the hard mask layer 302. A P-type implantation is performed to form a P-type drain region 340 on the P-well 320. The P-type dopants are substantially vertically doped into the substrate 300. Also, the P-type drain region 340 is optionally annealed. Some of the P-type dopants may diffuse into the bottom portion of the semiconductor wire structure 306 during the annealing process. Therefore, the bottom portion of the semiconductor wire structure 306 can be regarded as a part of the P-type drain 340.

Referring to FIG. 72, the semiconductor wire structure 306 on the P-type drain region 340 is lightly doped with P-type dopants. Therefore, a P-type channel region 342 is formed on the P-type drain region 340. The doping concentration of the P-type channel region 342 is less than the doping concentration of the P-type drain region 340. Because the hard mask layer 302 covers the top surface of the semiconductor wire structure 306, the P-type dopants are doped into the semiconductor wire structure 306 via the side surface of the semiconductor wire structure 306. Namely, the P-type dopants are obliquely doped into the semiconductor wire structure 306. The BARC layer 336 and the mask layer 338 are removed after this step, as shown in FIG. 73. Also, the P-type channel region 342 is optionally annealed.

Referring to FIG. 74, a spacer layer 344 is formed on the substrate 300. The spacer layer 344 can be formed by a deposition process. The spacer layer 344 is made of dielectric material, such as silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$).

Referring to FIG. 75, the spacer layer 344 is patterned by, for example, a dry etching process, so as to expose the substrate 300 and the semiconductor wire structures 306. A metal layer 346 is formed on the substrate 300. The metal layer 346 is made of Ti, Co, Ni, NiCo, Pt, NiPt, Er, or Yb. In some embodiments, a cap layer is optionally formed on the metal layer 346. The cap layer, for example, can be a titanium nitride layer.

Referring to FIG. 76, one or more annealing processes are performed in a silicidation process. The material of the substrate 300 contains silicon; therefore, the portions of the substrate 300 in contact with the metal layer react with the metal layer and become bottom silicide regions 348 at this process. The bottom silicide regions 348 are formed on the P-type drain region 340 and the N-type drain region 332. The remaining metal layer is removed after the bottom silicide regions 348 are formed. The remaining metal layer is removed by, for example, a wet stripping process. Also, the remaining spacer layer 344 is removed after the bottom silicide regions 348 are formed, as shown in FIG. 77.

Referring to FIG. 78, an etch stop layer 350 is formed on the substrate 300, and an insulation layer 352 is formed on the etch stop layer 350. The etch stop layer 350 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$).

Referring to FIG. 79, the insulation layer 352 is polished by, for example, a CMP process. The process of polishing the insulation layer 352 is stopped on the etch stop layer 350.

Referring to FIG. 80, portions of the etch stop layer 350 and the insulation layer 352 are removed. The etch stop layer 350 and the insulation layer 352 are removed by one or more dry etching processes. The portions of the etch stop layer 350 and the insulation layer 352 above the P-type drain region 340 and the N-type drain region 332 are removed. The hard mask 302 (see FIG. 79) is also removed in this step. The remaining insulation layer 352 can be regarded as a bottom insulation layer.

Referring to FIG. 81, a high-k (HK) dielectric layer 354 and a P-type work function layer 356 are formed on the substrate 300. An interfacial layer (IL) is optionally formed between the high-k dielectric layer 354 and the substrate 300. The interfacial layer can be a silicon oxide ($SiO_2$) layer. Alternatively, the interfacial layer may optionally include HfSiO or SiON. In some embodiments, the interfacial layer includes a chemical $SiO_2$ layer with hydroxyl groups. With hydroxyl groups on the surface of the interfacial layer, the quality of subsequent high-k dielectric layer 354 may be enhanced.

The high-k dielectric layer 354 is formed over the interfacial layer by ALD, CVD, metal organic CVD (MOCVD), PVD, thermal oxidation, or combinations thereof. The high-k dielectric layer 354 may include a binary or ternary high-k film such as HfOx. Alternatively, the high-k dielectric layer 354 may optionally include high-k dielectrics such as LaO, AlO, ZrO, $ZrO_2$, TiO, $Ta_2O_5$, $Y_2O_3$, $SrTiO_3$ (STO), $BaTiO_3$ (BTO), BaZrO, HfZrO, $HfZrO_2$, HfLaO, HfSiO, LaSiO, $La_2O_3$, AlSiO, $TiO_2$, HfTaO, HfTiO, $HfO_2$, (Ba,Sr)$TiO_3$ (BST), $Al_2O_3$, $Si_3N_4$, oxynitrides, or other materials.

The P-type work function layer 356 can be TiN, W, Ta, Ni, Pt, Ru, Mo, Al, WN, or combinations thereof. The P-type work function layer 356 can be formed by ALD, PVD, CVD, or other process.

Referring to FIG. 82, a BARC layer 358 and a mask layer 360 are formed on the substrate 300 and are patterned. The semiconductor wire structures 306 above the N-well 320 is covered by the BARC layer 358 and the mask layer 360 while portions of the BARC layer 358 and the mask layer 360 above the P-well 326 are removed. A portion of the P-type work function layer 356 above the P-well 326 is removed. After the portion of the P-type work function layer 356 is removed, the BARC layer 358 and the mask layer 360 are also removed.

Referring to FIG. 83, an N-type work function layer 362 is formed on the substrate 300. The N-type work function layer 362 can be Ti, Ag, Al, TiAlMo, Ta, TaN, TiAlC, TiAlN, TaC, TaCN, TaSiN, Mn, Zr, or combinations thereof. The N-type work function layer 362 can be formed by ALD, PVD, CVD, or other process.

Referring to FIG. 84, a metal gate layer 364 is formed on the substrate 300. The metal gate layer 364 is deposited on the N-type work function layer 362 by ALD, PVD, CVD, or other process. The metal gate layer 364 can be Al, W, Co, or Cu.

Referring to FIG. 85, portions of the metal gate layer 364, the P-type work function layer 356, the N-type work function layer 362, and the high-k dielectric layer 354 are removed by, for example, a dry etching process. The dry etching process is stopped on the bottom insulation layer 352.

Figure 86:
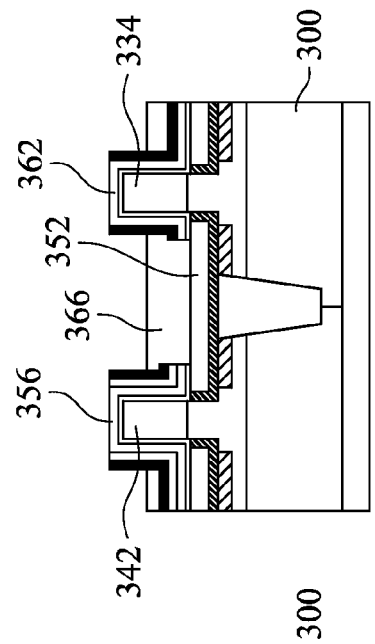

Referring to FIG. 86, an insulation layer 366 is formed on the substrate 300. The gaps between the semiconductor wire structures 306 are filled with the insulation layer 366.

Figure 87:
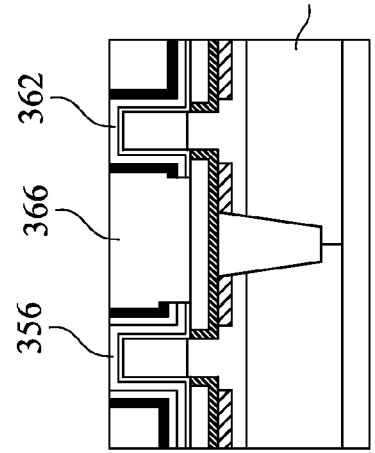

Referring to FIG. 87, the insulation layer 366 is polished by, for example, a CMP process. The insulation layer 366 is polished, and the polish process is stopped on the P-type work function layer 356 and the N-type work function layer 362.

Figure 88:
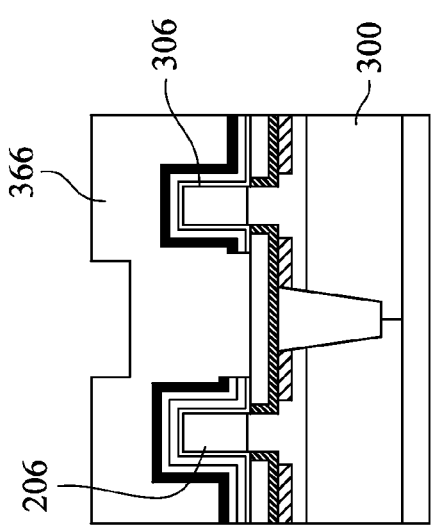

Referring to FIG. 88, the insulation layer 366 is etched by a dry etching or wet etching process. A portion of the insulation layer 366 is removed. The remaining insulation layer 366 can be regarded as a middle insulation layer, which is disposed on the bottom insulation layer 352. The top surface of the middle insulation layer 366 is lower than the top surface of the channel regions 334 and 342.

Figure 89:
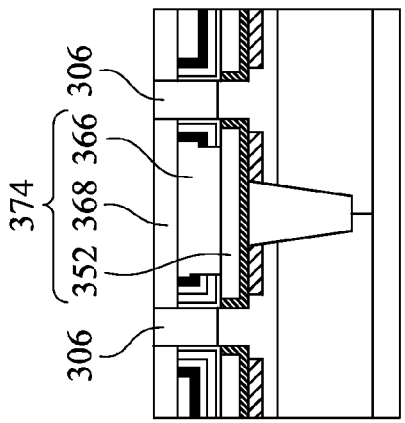

Referring to FIG. 89, the top areas of the metal gate layer 364, the P-type work function layer 356, the N-type work function layer 362, and the high-k dielectric layer 354 are removed by, for example, a dry etching or wet etching process. The top portion of the N-type channel regions 334 and the P-type channel region 342 are exposed. The metal gate layer 364 is disposed around the N-type channel region 334 and the P-type channel region 342, and the high-k dielectric layer 354 is disposed between the metal gate layer 364 and the channel regions 334, 342.

Figure 90:
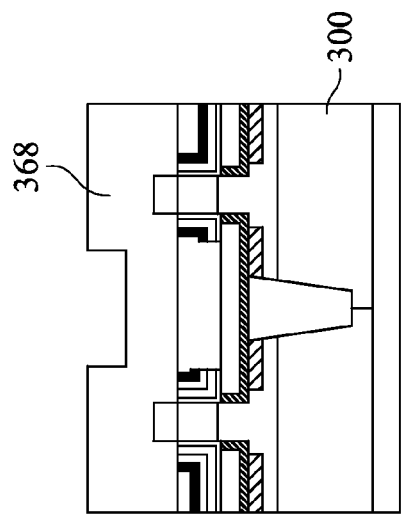
Figure 91:
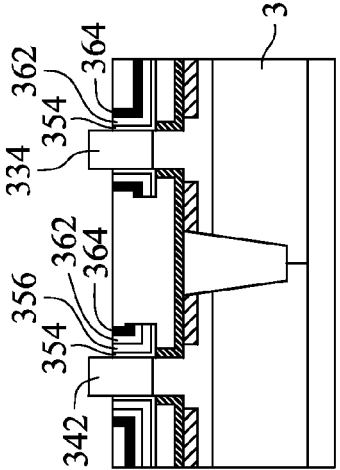

Referring to FIG. 90, an insulation layer 368 is formed on the substrate 300, and the insulation layer 368 is polished as shown in FIG. 91. The top surface of the insulation layer 368 is substantially level with the top surface of the semiconductor wire structures 306. The remaining insulation layer 368 can be regarded as a top insulation layer, which is disposed on the middle insulation layer 366. The top insulation layer 368, the middle insulation layer 366, and the bottom insulation layer 352 are made of same dielectric material and are regarded as an insulation layer 374 hereafter.

Referring to FIG. 92, a mask layer 376 is formed on the insulation layer 374. The mask layer 376 is patterned, and the portion of the mask layer 376 disposed above the P-well 326 is removed. The semiconductor wire structure 306 disposed on the P-well 326 is exposed by the mask layer 376. Then, a P-type implantation is performed to the semiconductor wire structure 306 to form a P-type source region 378 on the N-type channel region 334. P-type dopants enter the semiconductor wire structure 306 via the top surface of the semiconductor wire structure 306. The N-type drain region 332, the N-type channel region 334, and the P-type source region 378 are substantially vertically stacked. The doping concentration of the P-type source region 378 is greater than the doping concentration of the N-type drain region 332, such that the current can go through the N-type channel region 334 more easily. The N-type drain region 322 and/or the P-type source region 378 has a doping concentration in a range from about $1*10^{18}$ atoms/cm$^3$ to about $1*10^{22}$ atoms/cm$^3$. The N-type channel region 334 has a doping concentration in a range from about $1*10^{12}$ atoms/cm$^3$ to about $1*10^{18}$ atoms/cm$^3$. After the P-type source region 378 is formed, the mask layer 376 is removed.

Referring to FIG. 93, a mask layer 382 is formed on the insulation layer 374. The mask layer 382 is patterned, and the portion of the mask layer 382 disposed above N-well 320 is removed. The semiconductor wire structure 306 disposed on the N-well 320 is exposed by the mask layer 382. Then, an N-type implantation is performed to the semiconductor wire structure 306 to form an N-type source region 384 on the P-type channel region 342. N-type dopants enter the semiconductor wire structure 306 via the top surface of the semiconductor wire structure 306. The P-type drain region 340, the P-type channel region 342, and the N-type source region 384 are substantially vertically stacked. The doping concentration of the N-type source region 384 is greater than the doping concentration of the P-type drain region 340, such that the current can go through the P-type channel region 342 more easily. The N-type source region 384 and/or the P-type drain region 340 has a doping concentration in a range from about $1*10^{18}$ atoms/cm$^3$ to about $1*10^{22}$ atoms/cm$^3$. The P-type channel region 342 has a doping concentration in a range from about $1*10^{12}$ atoms/cm$^3$ to about $1*10^{18}$ atoms/cm$^3$. After the N-type source region 384 is formed, the mask layer 382 is removed.

Referring to FIG. 94, one or more annealing processes are performed to diffuse and activate the source and drain regions. Because the source regions, the channel regions and the drain regions are formed by the implantation process, so that at least one of the source regions, the channel regions and the drain regions has a graded doping concentration. After the annealing process is performed, the insulation layer 374 is etched back, and the top surface of the insulation layer 374 is substantially level with the N-type channel region 334 and the P-type channel region 342.

Figure 95:
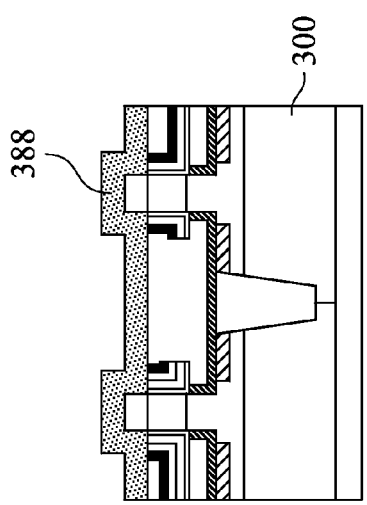

Referring to FIG. 95, a dielectric hard mask layer 388 is formed on the substrate 300. The dielectric hard mask layer 388 can be dielectric material such as silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide (SiO$_2$). The dielectric hard mask layer 388 is utilized for later self-aligned contact process.

Figure 96:
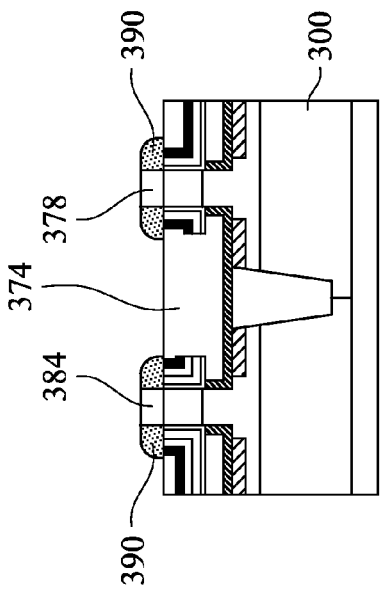

Referring to FIG. 96, the dielectric hard mask layer is etched by an anisotropic etch, and a plurality of sidewall spacers 390 are formed at the sidewall of the semiconductor wire structures 306. The sidewall spacers 390 are disposed around the N-type source region 384 and the P-type source region 378.

Figure 97:
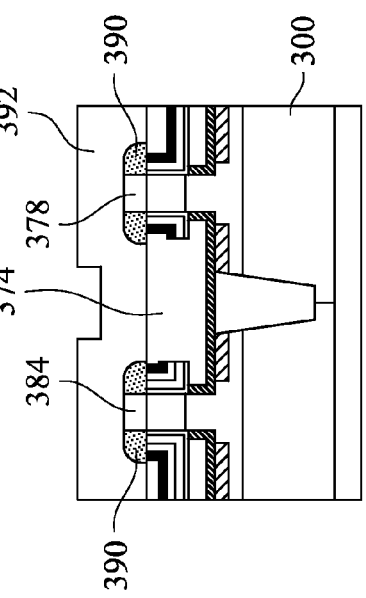

Referring to FIG. 97, an insulation layer 392 is formed on the substrate 300 and covers the insulation layer 374 and the sidewall spacers 390. Thus the gaps between the N-type source region 384 and the P-type source region 378 are filled with the insulation layer 392. The sidewall spacers 390 and the insulation layer 392 are made of different materials.

Figure 98:
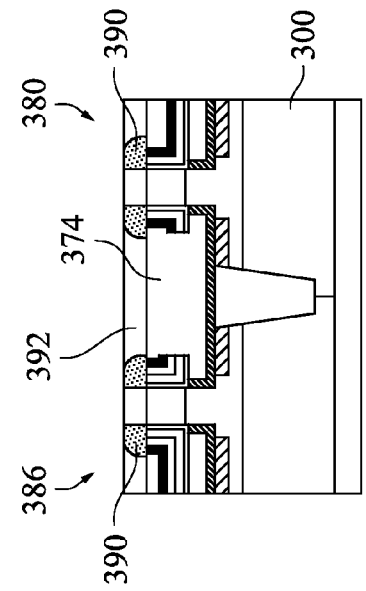

Referring to FIG. 98, the insulation layer 392 is polished. The polish process is stop at the sidewall spacers 390. The remaining insulation layer 392 is regarded as a part of the insulation layer 374 hereafter. The sidewall spacers 390 are surrounded by the insulation layer 374. After this step, an N-type tunnel field-effect transistor 380 and a P-type tunnel field-effect transistor 386 with vertical gate all around (VGAA) structures are formed.

Figure 99:
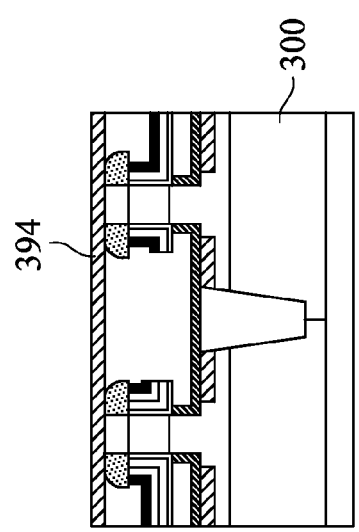

Referring to FIG. 99, a silicon-contained layer 394 is formed on the substrate 300. The silicon-contained layer 394 can be an amorphous silicon or poly-silicon layer.

Figure 100:
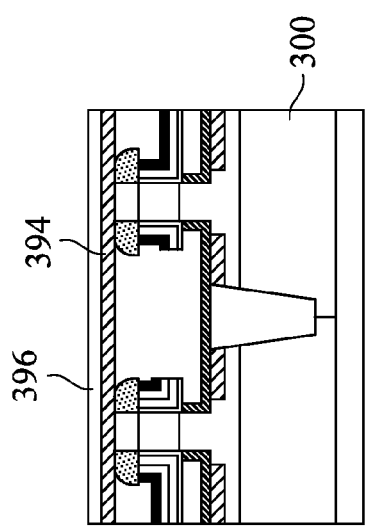

Referring to FIG. 100, a metal layer 396 is formed on the silicon-contained layer 394. The metal layer 396 is made of, for example, Ti, Co, Ni, NiCo, Pt, NiPt, Er, or Yb. In some embodiments, a cap layer is optionally formed on the metal layer 396. The cap layer is made of, for example, titanium nitride.

Figure 101:
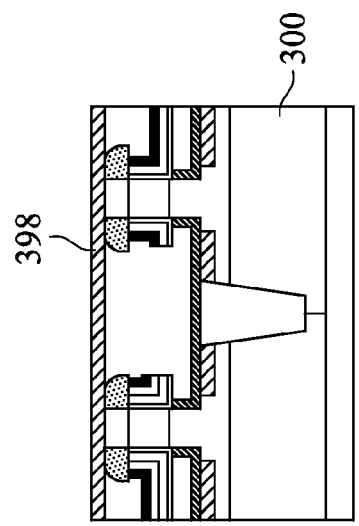

Referring to FIG. 101, one or more annealing processes are performed in a silicidation process. The silicon-contained layer is in contact with the metal layer and reacts with the metal layer to become a top silicide layer 398 at this process. The remaining metal layer can be removed by, for example, a wet stripping process.

Figure 102:
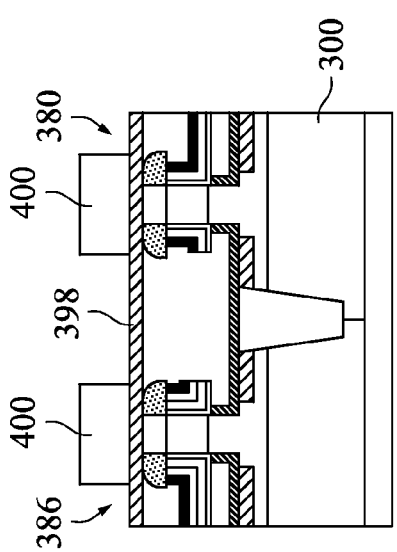

Referring to FIG. 102, a mask layer 400 is formed on the top silicide layer 398, and the mask layer 400 is patterned to form a plurality features and openings defined by the features. The P-type tunnel field-effect transistor 386 and the N-type tunnel field-effect transistor 380 are covered by the mask layer 400, and the portion of the top silicide layer 398 exposed by the mask layer 400 is removed. The mask layer 400 is removed after this step.

Figure 103:
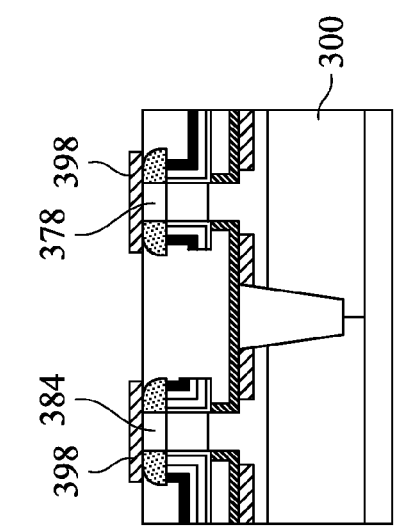

Referring to FIG. 103, the patterned top silicide layer 398 is formed on the N-type source region 384 and the P-type source region 378 as a plurality of top silicide regions.

Referring to FIG. 104, an insulation layer 402 is formed on the substrate 300 and is polished. The top surface of the insulation layer 402 is higher than the top surface of the N-type tunnel field-effect transistor 380 and the P-type tunnel field-effect transistor 386. The remaining insulation layer 402 and the insulation layer 374 are called insulation layer 404 hereafter. The N-type tunnel field-effect transistor 380 and the P-type tunnel field-effect transistor 386 are isolated by the insulation layer 404.

Referring to FIG. 105, the insulation layer 404 is patterned, and a plurality of openings 406 are formed in the insulation layer 404. The openings 406 expose the metal gate layer 364, the bottom silicide regions 348, and the top silicide layer 398, respectively. The openings 406 can be formed by a dry etching process, in which the insulation layer 404 is etched at a greater rate than the sidewall spacers 390, such the N-type source region 384 and the P-type source region 378 are protected during the etch process. Because of the sidewall spacers 390, the openings 406 lead to the bottom silicide regions 348, and the metal gate layer 364 have at least two different diameters. Thus diameter of the openings 406 above the sidewall spacers 390 is larger than that under the sidewall spacers 390.

Referring to FIG. 106, a conductive material 408 is deposited, and the openings 406 are filled with the conductive material 408. The conductive material 408, for example, can be formed by a W, Co, Al, or Cu deposition. Then, the conductive material 408 is polished by, for example, a CMP process.

Referring to FIG. 107, a plurality of contact structures 410 are formed in the openings 406. The contact structures 410 are connected to metal gate layer 364, the bottom silicide regions 348, and the top silicide layer 398, respectively. The contact structures 410 are connected to the drain regions 332 and 348 via the bottom silicide regions 348. The contact structures 410 are connected to the source regions 384 and 378 via the top silicide layer 398. Because the openings 406 have different diameters above and under the sidewall spacers 390, the corresponding contact structures 410 also have different diameters above and under the sidewall spacers 390. For example, the contact structure 410 connected to the metal gate layer 364 is regarded as a gate contact, and the cross-sectional area of the gate contact above the sidewall spacer 390 is larger than that under the sidewall spacer 390. This process is also called self-aligned contact (SAC). The sidewall spacers 390 can prevent electrical shorts between the contact structures 410.

Referring to FIG. 108, a plurality of electrodes 412 are formed on the contact structures 410 respectively for later interconnection, such as a back end of line (BEOL) process. The electrodes 412 include gate electrodes, source electrodes, and drain electrodes. The electrodes 412 can be Cu, Co, or other metal.

As described above, the tunnel field-effect transistor component including one or more tunnel field-effect transistors is provided. The tunnel field-effect transistor includes a high-k metal gate structure and thus has immunity to the short channel effect. The tunnel field-effect transistors may have opposite conductive types. Furthermore, by using the self-aligned contact process, the electric shorts between the contact structures can be prevented.

The above illustrations include exemplary operations, but the steps in operations are not necessarily performed in the order shown. Steps may be added, replaced, changed order, and/or eliminated as appropriate, in accordance with the spirit and scope of various embodiments of the present disclosure. For instance, the shallow trench isolation can be formed before or after the semiconductor wire structures are formed; the source regions can be implanted before or after the metal gate structures are formed; the step of forming the sidewall spacers is optionally performed.

According to various aspects of the present disclosure, the tunnel field-effect transistor includes a drain region, a source region with opposite conductive type to the drain region, a channel region disposed between the drain region and the source region, a metal gate layer disposed around the channel region, and a high-k dielectric layer disposed between the metal gate layer and the channel region.

In one or more embodiments, the drain region, the source region, and the channel region are substantially vertically stacked. The doping concentration of the source region is greater than a doping concentration of the drain region. At least one of the source region, the drain region, and the channel region has a graded doping concentration.

In one or more embodiments, the tunnel field-effect transistor further includes a sidewall spacer disposed around the source region, an insulation layer disposed at least around the sidewall spacer, and a gate contact. The insulation layer and the sidewall spacer are made of different materials, and the insulation layer has at least one opening therein to expose a metal gate layer. The gate contact is connected to the metal gate layer through the opening, and the sidewall spacer is disposed between the gate contact and the source region. The cross-sectional area of the gate contact above the sidewall spacer is larger than that under the sidewall spacer.

According to various aspects of the present disclosure, the tunnel field-effect transistor component includes a substrate having a first-type well, a second-type well, and a shallow trench isolation feature separating the first-type well and the second-type well. The tunnel field-effect transistor components includes a first-type tunnel field-effect transistor disposed on the second-type well, and a second-type tunnel field-effect transistor disposed on the first-type well. The first-type tunnel field-effect transistor includes a first-type drain region, a second-type source region, a first-type channel region disposed between the first-type drain region and the second-type source region, a first metal gate layer disposed around the first-type channel region, and a first high-k dielectric layer disposed between the first metal gate layer and the first-type channel region. The second-type tunnel field-effect transistor includes a second-type drain region, a first-type source region, a second-type channel region disposed between the second-type drain region and the first-type source region, a second metal gate layer disposed around the second-type channel region, and a second high-k dielectric layer disposed between the second metal gate layer and the second-type channel region.

In one or more embodiments, the first-type drain region, the second-type source region, and the first-type channel region are substantially vertically stacked. The second-type drain region, the first-type source region, and the second-type channel region are substantially vertically stacked.

In one or more embodiments, the doping concentration of the first-type source region is larger than the doping concentration of the second-type drain region. The doping concentration of the second-type source region is larger than the doping concentration of the first-type drain region. At least one of the first-type source region, the first-type drain region, the first-type channel region, the second-type source region, the second-type drain region, and the second-type channel region has a graded doping concentration.

In one or more embodiments, the tunnel field-effect transistor component further includes a silicide region formed on the first source region and the second source region, and a plurality of sidewall spacers respectively disposed around the first and second source regions. The sidewall spacers are disposed between the silicide region and the metal gate layer.

According to various aspects of the present disclosure, the method for fabricating a tunnel field-effect transistor includes providing a substrate, forming a semiconductor wire structure on the substrate, forming a high-k dielectric layer, and a metal gate layer. The semiconductor wire structure includes a bottom source or drain region formed on the substrate, a channel region formed on the bottom source or drain region, and a top source or drain region formed on the channel region. The high-k dielectric layer is formed around the channel region, and the metal gate layer is formed around the high-k dielectric layer.

In one or more embodiments, a bottom silicide region is formed on the bottom source or drain region, and a top silicide region is formed on the top source or drain region.

In one or more embodiments, the method further includes forming a sidewall spacer around the channel region, forming an insulation layer over the substrate and at least around the sidewall spacer, forming at least one opening in the insulation layer to expose the metal gate layer in an etching process that etches the insulation layer at a greater rate than the sidewall spacer such that the channel region is protected during the etch process, and filling the opening with a conductive material. The insulation layer and the sidewall spacer are made of different materials.

In one or more embodiments, the method further includes forming a sidewall spacer around the channel region, forming an insulation layer over the substrate and at least around the sidewall spacer, forming at least one opening in the insulation layer to expose the bottom source or drain region in an etching process that etches the insulation layer at a greater rate than the sidewall spacer such that the channel region is protected during the etch process, and filling the opening with a conductive material. The insulation layer and the sidewall spacer are made of different materials.

In one or more embodiments, the method further includes forming a sidewall spacer around the top source or drain region, forming an insulation layer over the substrate and at least around the sidewall spacer, and forming at least one opening in the insulation layer to expose the metal gate layer. The cross-sectional area of the opening above the sidewall spacer is larger than that under the sidewall spacer. The insulation layer and the sidewall spacer are made of different materials.

In one or more embodiments, the act for forming the semiconductor wire structure includes forming at least one wire body on the substrate, and performing a series of implantation processes on the wire body to form the bottom source or drain region, the channel region, and the top source or drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tunnel field-effect transistor comprising:
   a substrate;
   a semiconductor column protruding from the substrate;
   a drain region disposed as a first portion of the semiconductor column;
   a source region disposed as a second portion of the semiconductor column, wherein the drain and source regions are of opposite conductive types;
   a channel region disposed as a third portion of the semiconductor column and between the drain region and the source region;
   a metal gate layer surrounding the channel region;
   a high-k dielectric layer disposed between the metal gate layer and the channel region;
   a sidewall spacer disposed around the source region; and
   a gate contact connected to the metal gate layer, wherein the gate contact is in contact with the sidewall spacer and is self-aligned by the sidewall spacer.

2. The tunnel field-effect transistor of claim 1, wherein at least one of the source region, the drain region, and the channel region has a graded doping concentration.

3. The tunnel field-effect transistor of claim 1, further comprising:
   an insulation layer disposed at least around the sidewall spacer, wherein the insulation layer and the sidewall spacer are made of different materials.

4. The tunnel field-effect transistor of claim 1, wherein a width of a first portion of the gate contact that is above the sidewall spacer is larger than a width of a second portion of the gate contact that is under the sidewall spacer.

5. A tunnel field-effect transistor component comprising:
   a substrate having a first-type well, a second-type well, and a shallow trench isolation feature separating the first-type well and the second-type well;
   a first-type tunnel field-effect transistor disposed on the second-type well, the first-type tunnel field-effect transistor comprising:
   a first-type drain region;

a second-type source region;

a first-type channel region disposed between the first-type drain region and the second-type source region;

a first metal gate layer encircling the first-type channel region; and a first high-k dielectric layer disposed between the first metal gate layer and the first-type channel region;

a first work function metal layer disposed between the first high-k dielectric layer and the first metal gate layer; and a second-type tunnel field-effect transistor disposed on the first-type well, the second-type tunnel field-effect transistor comprising:

a second-type drain region;

a first-type source region;

a second-type channel region disposed between the second-type drain region and the first-type source region;

a second metal gate layer encircling the second-type channel region; and a second high-k dielectric layer disposed between the second metal gate layer and the second-type channel region.

6. The tunnel field-effect transistor component of claim 5, wherein the first-type drain region, the second-type source region, and the first-type channel region are substantially vertically stacked.

7. The tunnel field-effect transistor component of claim 5, wherein the second-type drain region, the first-type source region, and the second-type channel region are substantially vertically stacked.

8. The tunnel field-effect transistor component of claim 5, wherein a doping concentration of the second-type source region is larger than a doping concentration of the first-type drain region.

9. The tunnel field-effect transistor component of claim 5, wherein at least one of the first-type source region, the first-type drain region, the first-type channel region, the second-type source region, the second-type drain region, and the second-type channel region has a graded doping concentration.

10. The tunnel field-effect transistor component of claim 5, further comprising:

a silicide region formed on the first-type source region and the second-type source region; and a plurality of sidewall spacers respectively disposed around the first-type and second-type source regions, and disposed between the silicide region and the first and second metal gate layers.

11. The tunnel field-effect transistor of claim 1, further comprising a work function metal layer disposed between the high-k dielectric layer and the metal gate layer.

12. The tunnel field-effect transistor of claim 1, further comprising an interfacial layer disposed between the high-k dielectric layer and the substrate.

13. The tunnel field-effect transistor of claim 1, wherein the drain region is disposed between the substrate and the channel region.

14. The tunnel field-effect transistor of claim 13, further comprising a silicide region formed on the source region.

15. The tunnel field-effect transistor component of claim 5, further comprising:

a second work function metal layer disposed between the second high-k dielectric layer and the second metal gate layer and having the same conductive type as the first work function metal layer; and a third work function metal layer disposed between the second high-k dielectric layer and the second metal gate layer and having a conductive type opposite to the conductive type of the first work function metal layer.

16. The tunnel field-effect transistor component of claim 5, wherein the first-type drain region is disposed between the second-type well and the first-type channel region, and the second-type drain region is disposed between the first-type well and the second-type channel region.

17. The tunnel field-effect transistor of claim 1, further comprising an electrode disposed on the gate contact.

18. The tunnel field-effect transistor of claim 17, wherein the electrode is in direct contact with the gate contact.

19. A tunnel field-effect transistor comprising:

a substrate;

a drain region on the substrate;

a source region above the drain region, wherein the drain and source regions are of opposite conductive types;

a channel region between the drain region and the source region;

an insulation layer surrounding the drain region;

an etch stop layer between the drain region and the insulation layer and surrounding the drain region; and a gate dielectric layer surrounding the channel region and above the etch stop layer.

20. The tunnel field-effect transistor of claim 19, wherein the gate dielectric layer is in contact with the channel region.

* * * * *